(12) United States Patent
Yokozeki

(10) Patent No.: US 6,741,487 B2
(45) Date of Patent: May 25, 2004

(54) SEMICONDUCTOR MEMORY

(75) Inventor: Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/202,855

(22) Filed: Jul. 26, 2002

(65) Prior Publication Data

US 2003/0090951 A1 May 15, 2003

(30) Foreign Application Priority Data

Nov. 9, 2001 (JP) ........................................ 2001-344484

(51) Int. Cl.$^7$ ................................................ G11C 5/06
(52) U.S. Cl. ..................... 365/63; 365/230.03
(58) Field of Search ..................... 365/63, 51, 185.11, 365/230.03, 149, 190, 203

(56) References Cited

U.S. PATENT DOCUMENTS 4,926,382 A * 5/1990 Sakui et al. ............... 365/203
6,091,629 A * 7/2000 Osada et al. ............... 365/154
6,151,237 A * 11/2000 Naritake ..................... 365/63

FOREIGN PATENT DOCUMENTS

JP   2000-207886   7/2000

* cited by examiner

*Primary Examiner*—Tan T. Nguyen
(74) *Attorney, Agent, or Firm*—Arent Fox, PLLC

(57) ABSTRACT

A semiconductor memory that reduces the amount of power consumed by an entire unit by decreasing a charging/discharging current. A row direction selection circuit selects predetermined memory cell groups in a row direction in response to a row input address signal. A column direction selection circuit selects predetermined memory cell groups in a column direction in response to a column input address signal. Connection-disconnection circuits connect a divided bit line corresponding to a column selected by the column direction selection circuit of divided bit lines connected to memory cell groups, respectively, selected by the row direction selection circuit to the corresponding common bit line and do not connect divided bit lines corresponding to the other columns.

17 Claims, 15 Drawing Sheets

SEMICONDUCTOR MEMORY

BACKGROUND OF THE INVENTION (1) Field of the Invention

This invention relates to a semiconductor memory and, more particularly, to a SEMICONDUCTOR MEMORY having divided bit lines obtained by dividing bit lines to which memory cells are connected into more than one in a column direction and common bit lines used for getting voltage output to the divided bit lines column by column.

(2) Description of the Related Art

Bit line hierarchy systems which enable a reduction of power consumption and high-speed processing in random access memories (RAMs) have been proposed. With these bit line hierarchy systems, a memory array is divided into a plurality of banks. A divided bit line in each bank is actually connected to a memory cell. A common bit line is located parallel to this divided bit line over each bank. A common bit line is not connected to a memory cell, so its load capacity per unit length is smaller than that of a divided bit line. Therefore, compared with cases where bit lines are not hierarchized, these bit line hierarchy systems enable high-speed low-power read/write operation.

Conventional bit line hierarchy systems are disclosed in, for example, Low-power High-speed LSI circuits & Technology, Sipec Corp. (the former Realize Inc.), 1998, p. 187, and Japanese Patent Laid-Open Publication No. 2000-207886.

FIG. 15 shows an example of a block diagram of a static RAM (SRAM) in which a bit line division system is adopted. As shown in FIG. 15, a conventional SRAM comprises a timing control circuit 1, a row decoder 2, a word line driver 3, a bank decoder 4, a column decoder 5, banks B1 through Bn, pre-charge circuits PC1 through PCp, column switches CS1 through CSp, and an I/O circuit 6.

The timing control circuit 1 inputs an address signal, clock signal, and control signal and controls the row decoder 2, bank decoder 4, column decoder 5, and pre-charge circuits PC1 through PCp on the basis of these signals.

The row decoder 2 decodes a row input address signal supplied from the timing control circuit 1, controls the word line driver 3 according to the result, and selects predetermined memory cell groups in a row direction.

The column decoder 5 decodes a column input address signal supplied from the timing control circuit 1, controls the column switches CS1 through CSp according to the result, and selects predetermined memory cell groups.

The word line driver 3 selects predetermined memory cell groups in the row direction under the control of the row decoder 2.

Under the control of the timing control circuit 1 the bank decoder 4 controls bank control circuits BC1 through BCp included in each of the banks B1 through Bn for selecting them.

Each of the banks B1 through Bn includes a memory cell group divided by predetermined numbers (m's, in this example) in a column direction. When data is read or written, predetermined memory cells are selected by the word line driver 3. These memory cells are connected to the corresponding divided bit lines BL11 through BLp1, respectively, and are connected to the corresponding auxiliary divided bit lines BLX11 through BLXp1 respectively. Furthermore, predetermined banks are selected by the bank control circuits BC1 through BCp. These banks are connected to common bit lines GBL1 through GBLp, respectively, and are connected to auxiliary common bit lines GBLX1 through GBLXp respectively.

Memory cells (MCs) C11 through C1m, ..., and Cp1 through Cpm are the smallest units that store data.

The bank control circuits BC1 through BCp go into the ON or OFF state under the control of the bank decoder 4 to connect the divided bit lines BL11 through BLp1 to the common bit lines GBL1 through GBLp, respectively, and to connect the auxiliary divided bit lines BLX11 through BLXp1 to the auxiliary common bit lines GBLX1 through GBLXp respectively.

The pre-charge circuits PC1 through PCp perform the pre-charge operation of supplying electric charges to the common bit lines GBL1 through GBLp and auxiliary common bit lines GBLX1 through GBLXp, which have lost electric charges, under the control of the timing control circuit 1 after read operation is completed.

The column switches CS1 through CSp go into the ON or OFF state under the control of the column decoder 5 to connect one of the common bit lines GBL1 through GBLp corresponding to a predetermined column to a data bus DB and to connect one of the auxiliary common bit lines GBLX1 through GBLXp corresponding to the predetermined column to a data bus DB and an auxiliary data bus DBX respectively.

The I/O circuit 6 includes a sense amplifier, write amplifier, and input-output circuit. The I/O circuit 6 amplifies read data with the sense amplifier and outputs it. Moreover, the I/O circuit 6 amplifies input data with the write amplifier and sends it to the data bus DB and auxiliary data bus DBX.

FIG. 15 shows the details of only the bank B1. The structure of the banks B2 through Bn is the same as that of the bank B1.

Now, operation in the above conventional SRAM will be described.

First, descriptions will be given with a case where data is read from the memory cell C11 as an example. When an address from which data is to be read is input to the timing control circuit 1, the timing control circuit 1 supplies a predetermined control signal to the row decoder 2, bank decoder 4, and column decoder 5 on the basis of this address.

The row decoder 2 decodes the row input address signal supplied from the timing control circuit 1 and informs the word line driver 3 about which word line the word line driver 3 should select.

The word line driver 3 puts a predetermined word line into an active state under the control of the row decoder 2. In this example, data is to be read from the memory cell C11, so a word line connected to the memory cells C11 through Cp1 is put into an active state and the other word lines are put into an inactive state.

Then data will be read from the memory cells C11 through Cp1 and output voltage will be applied to the divided bit lines BL11 through BLp1 and auxiliary divided bit lines BLX11 through BLXp1.

The bank decoder 4 puts all the bank control circuits BC1 through BCp included in the bank B1 into the ON state. As a result, the divided bit lines BL11 through BLp1 included in the bank B1 are connected to the common bit lines GBL1 through GBLp, respectively, and the auxiliary divided bit lines BLX11 through BLXp1 included in the bank B1 are connected to the auxiliary common bit lines GBLX1 through GBLXp respectively. Therefore, data stored in the memory cell C11 is supplied to the common bit line GBL1 and auxiliary common bit line GBLX1. In this case, the bank control circuits BC2 through BCp also go into the ON state, so data stored in the memory cells C21 through Cp1 is read and is output to the common bit lines GBL2 through GBLp, respectively, and to the auxiliary common bit lines GBLX2 through GBLXp respectively.

The column decoder 5 decodes the column input address signal supplied from the timing control circuit 1 and puts one of the column switches CS1 through CSp which corresponds to the result into the ON state. In this example, data stored in the memory cell C11 is to be read, so the column switch CS1 goes into the ON state and the others go into the OFF state.

Data output from the column switch CS1 is supplied to the I/O circuit 6 via the data bus DB and auxiliary data bus DBX.

The I/O circuit 6 increases the voltage of the data read in this way to a predetermined value with the built-in sense amplifier and outputs it.

The operation of reading data stored in another memory cell is performed in the same way as described above, so descriptions of it will be omitted. The operation of writing data into a memory cell is performed in the same way as described above, except that data is read from the I/O circuit 6 side and is supplied to a memory cell. Therefore, descriptions of it will also be omitted.

Now, a charging/discharging current which runs through bit lines in an SRAM will be described. For example, if a bit line hierarchy system is not adopted, then a charging/discharging current which runs through bit lines is given by

[Numerical Expression 1]

$$Io = Cb \cdot Vb \cdot f \cdot N \qquad (1)$$

where

Cb=the capacitance of a bit line,
Vb=the amplitude of the potential of the bit line,
f=an operating frequency, and
N=the total number of columns.

On the other hand, if a bit line hierarchy system is adopted and a memory array is divided into Nb banks, then a charging/discharging current which runs through bit lines is given by

[Numerical Expression 2]

$$Ib = (Cb/Nb \cdot Vb + Cg \cdot Vg) \cdot f \cdot N \qquad (2)$$

where

Cg=the capacitance of a common bit line and
Vg=the amplitude of the potential of the common bit line.

If a memory array is divided into four (Nb=4) and the capacitance of a common bit line is equal to half of that of a bit line (Cg=Cb/2), then Ib is expressed by

[Numerical Expression 3]

$$Ib = (Cb/4 \cdot Vb + Cb/2 \cdot Vg) \cdot f \cdot N \qquad (3)$$

Moreover, if the amplitude of the potential of a divided bit line and the amplitude of the potential of the common bit line are the same (Vb=Vg), then Ib is expressed by

[Numerical Expression 4]

$$Ib = 3/4 \cdot Cb \cdot Vb \cdot f \cdot N \qquad (4)$$
$$= 3/4 \cdot Io$$

That is to say, a charging/discharging current which runs through the bit lines is reduced by a fourth (25%).

With conventional SRAMs, a column is selected by a column decoder and column switches (column multiplex system) and the amplitude of the potential of a bit line corresponding to the selected column is sent to a common data bus via a column switch and is input to a sense amplifier or output buffer. A sense amplifier or output buffer located is common to columns the predetermined number of which is Nc. This is the same with SRAMs in which a bit line hierarchy system is adopted.

However, only a pair of bit lines are actually selected and the amplitude of the potential of the remaining (N−1) bit lines is not used. Therefore, a charging/discharging current which runs through these bit lines will run to waste.

This problem will become more serious if the amplitude of voltage on common bit lines is high. A case where each of the bank control circuits BC1 through BCp shown in FIG. 15 includes a local sense amplifier to amplify minute amplitude of voltage generated on the divided bit lines BL11 through BLp1 and auxiliary divided bit lines BLX11 through BLXp1 for the purpose of generating high amplitude of voltage on the common bit lines GBL1 through GBLp and auxiliary common bit lines GBLX1 through GBLXp can be given as an example. If power supply voltage is Vdd, Vb=Vdd/20, and Vg=Vdd/2=10Vb, then the following expression is derived from the numerical expression 3.

[Numerical Expression 5]

$$Ib = (Cb/4 \cdot Vb + Cb/2 \cdot 10 \cdot Vb) \cdot f \cdot N \qquad (5)$$
$$= (1/4 + 5) \cdot Cb \cdot Vb \cdot f \cdot N$$
$$= 21/4 \cdot Io$$

That is to say, a charging/discharging current which runs through the bit lines increases by more than five times.

SUMMARY OF THE INVENTION

The present invention was made under the background circumstances as described above. An object of the present invention is to stabilize the operation of circuits and reduce the above wasteful charging/discharging current without increasing the area of a chip.

In order to achieve the above object, a semiconductor memory having divided bit lines obtained by dividing each of bit lines to which memory cells are connected into more than one in a column direction and common bit lines used for getting voltage output to the divided bit lines column by column is provided. This semiconductor memory comprises a row direction selection circuit for selecting predetermined memory cell groups in a row direction in response to a row input address signal, a column direction selection circuit for selecting predetermined memory cell groups in the column direction in response to a column input address signal, and connection-disconnection circuits which connect a divided bit line corresponding to a column selected by the column direction selection circuit of divided bit lines connected to memory cell groups, respectively, selected by the row direction selection circuit to the corresponding common bit line and which do not connect divided bit lines corresponding to the other columns.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
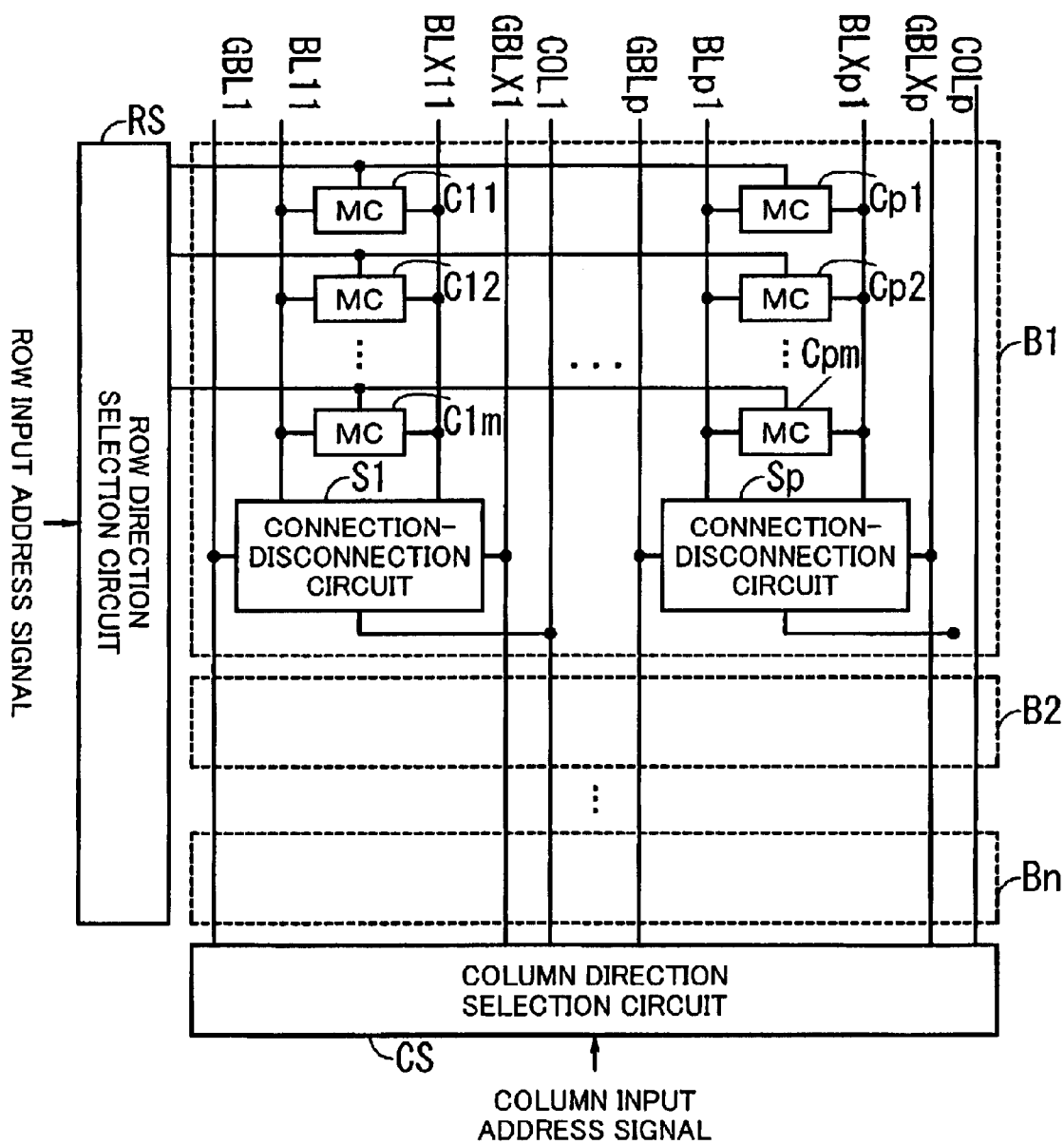
FIG. 1 is a view for describing the operative principles of the present invention.

FIG. 1 is a view for describing the operative principles of the present invention. As shown in FIG. 1, a semiconductor memory according to the present invention comprises a row direction selection circuit RS, a column direction selection circuit CS, and banks B1 through Bn. The bank B1, for example, includes p columns of m memory cells each. The same applies to the banks B2 through Bn.

The first column, for example, includes memory cells C11 through C1m. These cells are connected to a divided bit line BL11 and auxiliary divided bit line BLX11. The divided bit line BL11 and auxiliary divided bit line BLX11 are connected to a common bit line GBL1 and auxiliary common bit line GBLX1, respectively, via a connection-disconnection circuit S1. The same applies to the second through pth columns in the bank B1.

The row direction selection circuit RS selects a predetermined memory cell group in a row direction in response to a row input address signal.

The column direction selection circuit CS selects a predetermined memory cell group in a column direction in response to a column input address signal.

Connection-disconnection circuits S1 through Sp connect a divided bit line corresponding to a column selected by column direction selection signals COL1 through COLp output from the column direction selection circuit CS of divided bit lines BL11 through BLp1 connected to memory cell groups, respectively, selected by the row direction selection circuit RS to the corresponding common bit line of common bit lines GBL1 through GBLp, connect an auxiliary divided bit line corresponding to the column selected by the column direction selection signals COL1 through COLp output from the column direction selection circuit CS of auxiliary divided bit lines BLX11 through BLXp1 connected to the memory cell groups, respectively, selected by the row direction selection circuit RS to the corresponding auxiliary common bit line of auxiliary common bit lines GBLX1 through GBLXp, and do not connect a divided bit line corresponding to another column than the column.

Now, operation in FIG. 1 will be described. Descriptions will be given with read operation as an example. First, a row input address signal and column input address signal are supplied to the row direction selection circuit RS and column direction selection circuit CS respectively.

The row direction selection circuit RS decodes the row input address signal and selects a memory cell group in a row direction corresponding to the signal. For example, if data stored in the memory cell C11 is to be read, then the row direction selection circuit RS selects the memory cells C11 through Cp1.

As a result, data is read from the memory cells C11 through Cp1, ordinary signals are output to the divided bit lines BL11 through BLp1 respectively, and auxiliary signals are output to the auxiliary divided bit lines BLX11 through BLXp1 respectively.

Next, the column direction selection circuit CS puts a column direction selection signal for selecting a column a memory cell from which data is to be read belongs to into an active state. In this example, data stored in the memory cell C11 is to be read. The column direction selection circuit CS therefore puts a column direction selection signal COL1 into an active state and puts the other column direction selection signals into an inactive state. As a result, the connection-disconnection circuit S1 goes into the ON state, the divided bit line BL11 is connected to the common bit line GBL1, and the auxiliary divided bit line BLX11 is connected to the auxiliary common bit line GBLX1. Therefore, data read from the memory cell C11 will be supplied to the column direction selection circuit CS.

At this time all of the other connection-disconnection circuits S2 through Sp are in the OFF state and data is not output from them. Therefore, the potential of the common bit lines GBL2 through GBLp and the potential of the auxiliary common bit lines GBLX2 through GBLXp do not change.

The column direction selection circuit CS amplifies the data supplied from the connection-disconnection circuit S1 with a sense amplifier (not shown) and outputs it.

The above operation is performed when data is read from the memory cell C11. The same operation will be performed when data is read from another memory cell.

Write operation is performed in the same way as the operation of reading data, except that data is supplied from the column direction selection circuit CS to a desired memory cell. Descriptions of it therefore will be omitted.

As described above, with the semiconductor memory according to the present invention, the connection-disconnection circuits S1 through Sp connect a divided bit line corresponding to a column selected by the column direction selection circuit CS of divided bit lines connected to memory cell groups, respectively, selected by the row direction selection circuit RS to the corresponding common bit line, connect an auxiliary divided bit line corresponding to the column selected by the column direction selection circuit CS of auxiliary divided bit lines connected to the memory cell groups, respectively, selected by the row direction selection circuit RS to the corresponding auxiliary common bit line, and do not connect a divided bit line or an auxiliary divided bit line corresponding to another column than the column. Data therefore is output only to a common bit line and an auxiliary common bit line to be accessed. As a result, power wasted by a charging/discharging current running through other common bit lines and auxiliary common bit lines can be reduced.

Now, embodiments of the present invention will be described.

Figure 2:
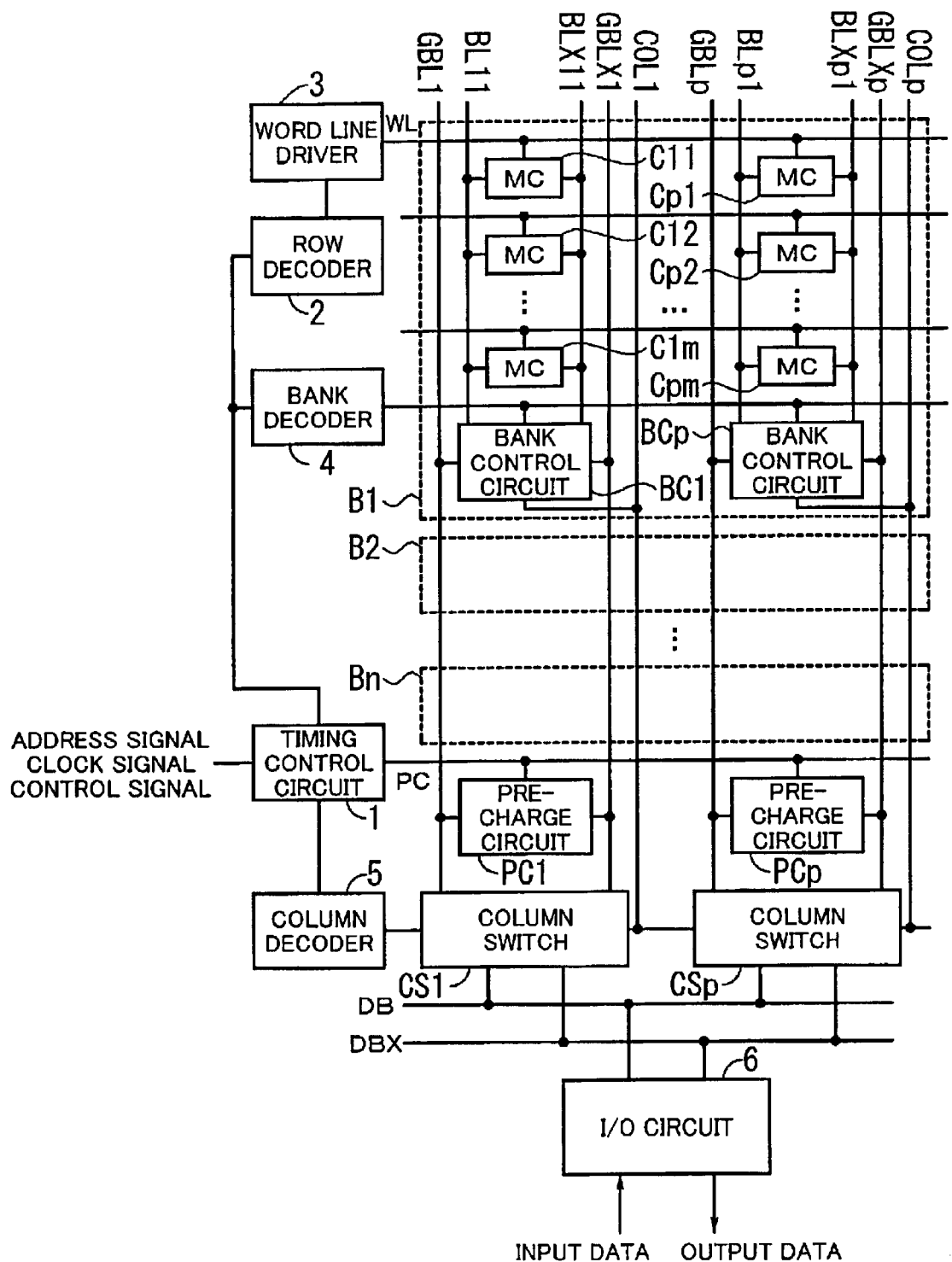
FIG. 2 is a circuit diagram showing the structure of a first embodiment of the present invention.

FIG. 2 is a view showing the structure of a first embodiment of the present invention. As shown in FIG. 2, the first embodiment of the present invention comprises a timing control circuit 1, a row decoder 2, a word line driver 3, a bank decoder 4, a column decoder 5, banks B1 through Bn, pre-charge circuits PC1 through PCp, column switches CS1 through CSp, and an I/O circuit 6. The bank B1, for example, includes p columns of m memory cells each. The same applies to the banks B2 through Bn. Memory cells C11 through C1m included in the first column, for example, are connected to a divided bit line BL11 where an ordinary signal is applied and an auxiliary divided bit line BLX11 where an auxiliary signal is applied. The divided bit line BL11 and auxiliary divided bit line BLX11 are connected to a common bit line GBL1 and auxiliary common bit line GBLX1, respectively, via a bank control circuit BC1. The same applies to the second through pth columns in the bank B1.

The timing control circuit 1 inputs an address signal, clock signal, and control signal and controls the row decoder 2, bank decoder 4, column decoder 5, and pre-charge circuits PC1 through PCp on the basis of these signals.

The row decoder 2 decodes a row input address signal supplied from the timing control circuit 1, controls the word line driver 3 according to the result, and selects predetermined memory cell groups in a row direction.

The column decoder 5 decodes a column input address signal supplied from the timing control circuit 1, controls the column switches CS1 through CSp according to the result, and selects predetermined memory cell groups in a column direction.

The word line driver 3 selects predetermined memory cell groups in the row direction under the control of the row decoder 2.

Under the control of the timing control circuit 1 the bank decoder 4 controls bank control circuits BC1 through BCp included in each of the banks B1 through Bn for selecting them.

As stated above, each of the banks B1 through Bn includes a memory cell group divided by predetermined numbers (m's, in this example) in the column direction. When data is read or written, predetermined memory cells are selected by the word line driver 3. These memory cells are connected to the corresponding divided bit lines BL11 through BLp1, respectively, and to the corresponding auxiliary divided bit lines BLX11 through BLXp1 respectively. Furthermore, predetermined banks are selected by the bank control circuits BC1 through BCp. These banks are connected to the common bit lines GBL1 through GBLp, respectively, and to the auxiliary common bit lines GBLX1 through GBLXp respectively.

The memory cells (MCs) C11 through C1m, ..., and Cp1 through Cpm are the smallest units that store data.

The bank control circuits BC1 through BCp go into the ON or OFF state under the control of the bank decoder 4 and the column decoder 5 to connect the divided bit lines BL11 through BLp1 to the common bit lines GBL1 through GBLp, respectively, and to connect the auxiliary divided bit lines BLX11 through BLXp1 to the auxiliary common bit lines GBLX1 through GBLXp respectively.

Figure 3A:
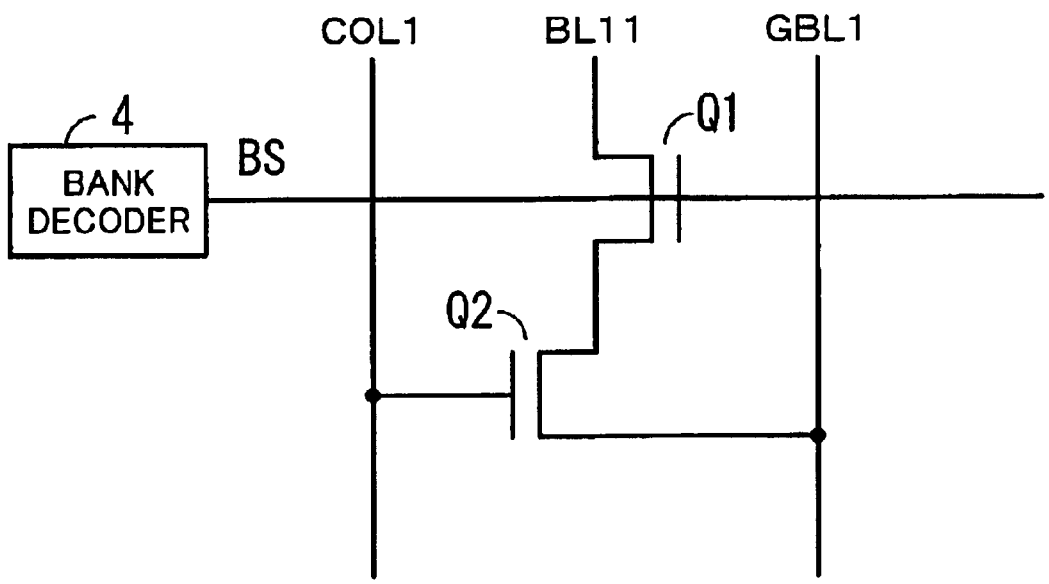
FIGS. 3(A) and 3(B) are circuit diagrams showing an example of the detailed structure of the bank control circuits shown in FIG. 2.
Figure 3B:
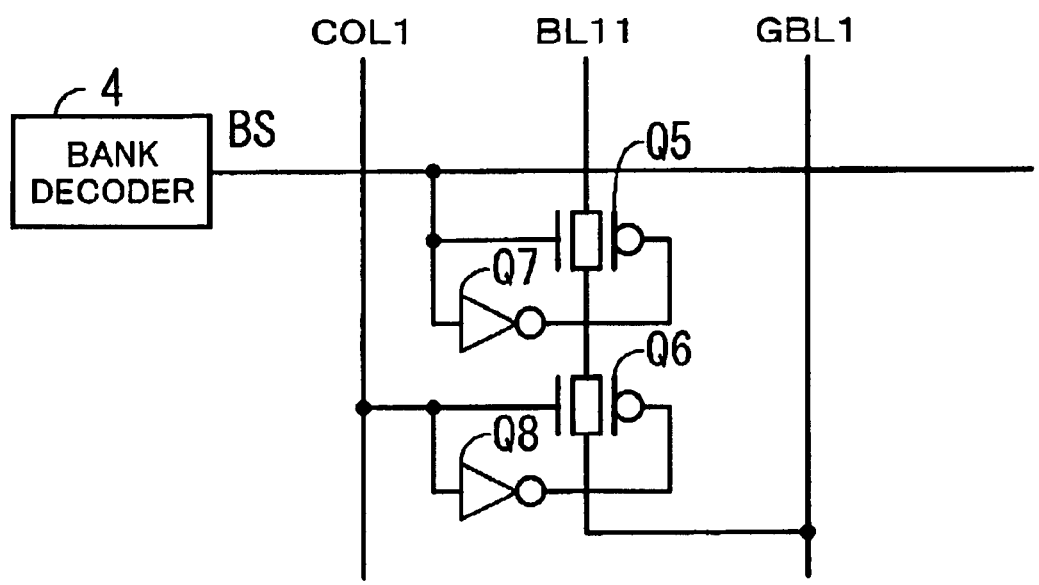

FIGS. 3(A) and 3(B) are views showing an example of the detailed structure of the divided bit line BL11 and common bit line GBL1 side of the bank control circuit BC1.

As shown in FIG. 3(A), the divided bit line BL11 and common bit line GBL1 side of the bank control circuit BC1 includes n-channel transistors Q1 and Q2. The divided bit line BL11 and common bit line GBL1 are connected on the basis of the logical product of a BS output from the bank decoder 4 and a column direction selection signal COL1 from the column decoder 5. The auxiliary divided bit line BLX11 and auxiliary common bit line GBLX1 side of the bank control circuit BC1 has the same structure as described above. Moreover, the structure of the other bank control circuits is the same as that of the bank control circuit BC1.

FIG. 3(B) is also a view showing an example of the detailed structure of the divided bit line BL11 and common bit line GBL1 side of the bank control circuit BC1.

In this example, the divided bit line BL11 and common bit line GBL1 side of the bank control circuit BC1 includes transfers Q5 and Q6 and inverters Q7 and Q8. When a BS output from the bank decoder 4 goes into the "H" state, the transfer Q5 goes into the ON state. When a column direction selection signal COL1 from the column decoder 5 goes into the "H" state, the transfer Q6 goes into the ON state. Therefore, when both of the BS output from the bank decoder 4 and the column direction selection signal COL1 go into the "H" state, both of the transfers Q5 and Q6 go into the ON state and the divided bit line BL11 and common bit line GBL1 are connected. The auxiliary divided bit line BLX11 and auxiliary common bit line GBLX1 side of the bank control circuit BC1 has the same structure as described above. Moreover, the structure of the other bank control circuits is the same as that of the bank control circuit BC1.

To return to FIG. 2, the pre-charge circuits PC1 through PCp perform the pre-charge operation of supplying electric charges to the common bit lines GBL1 through GBLp and auxiliary common bit lines GBLX1 through GBLXp, which have lost electric charges, under the control of the timing control circuit 1 after read operation is completed.

Under the control of the column decoder 5, one of the column switches CS1 through CSp goes into the ON state and the other column switches go into the OFF state to connect one of the common bit lines GBL1 through GBLp corresponding to a predetermined column to a data bus DB and to connect one of the auxiliary common bit lines GBLX1 through GBLXp corresponding to the predetermined column to the auxiliary data bus DBX.

Figure 4:
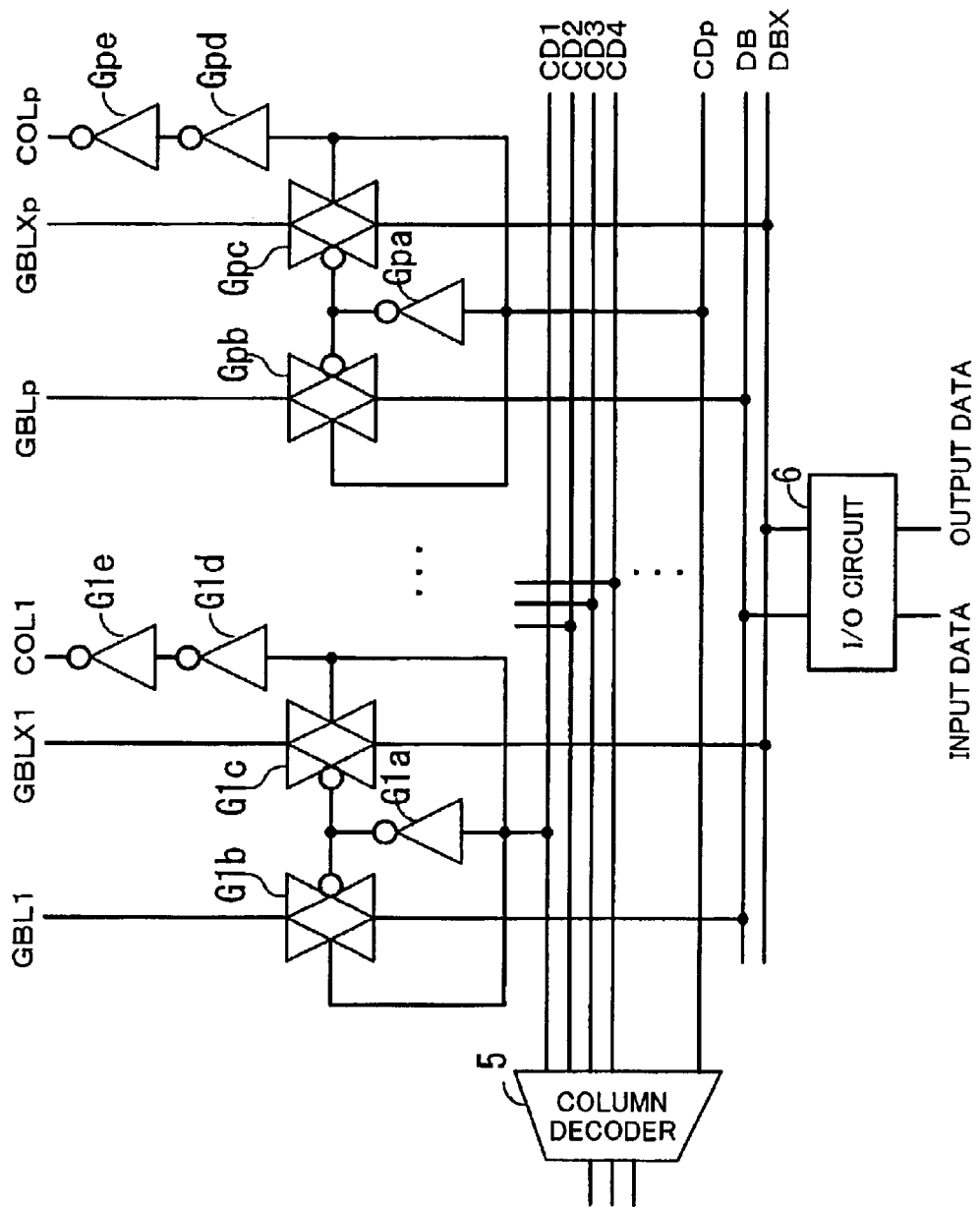
FIG. 4 is a circuit diagram showing an example of the detailed structure of the column switches shown in FIG. 2.

FIG. 4 is a view showing an example of the detailed structure of the column switches CS1 through CSp. The column switch CS1, for example, will now be described. The column switch CS1 includes inverters G1a, G1d, and G1e and transfers G1b and G1c. When a signal CD1 output from the column decoder 5 goes into the "H" state, both of the transfers G1b and G1c go into the ON state. The common bit line GBL1 and auxiliary common bit line GBLX1 therefore are connected to the data bus DB and auxiliary data bus DBX respectively.

A column direction selection signal COL1 is generated by inverting a signal CD1 output from the column decoder 5 twice by the inverters G1d and G1e. As a result, the logic of the column direction selection signal COL1 is the same as that of the signal CD1.

The column direction selection signal lines COL1 through COLp are located parallel to the common bit lines GBL1 through GBLp and auxiliary common bit lines GBLX1 through GBLXp. Therefore, compared with a case where the column direction selection signal lines COL1 through COLp are perpendicular to the common bit lines GBL1 through GBLp and auxiliary common bit lines GBLX1 through GBLXp, the area of a chip can be reduced.

The I/O circuit 6 includes a sense amplifier, write amplifier, and input-output circuit. The I/O circuit 6 amplifies read data with the sense amplifier and outputs it. Moreover, the I/O circuit 6 amplifies input data with the write amplifier and outputs it to the data bus DB and auxiliary data bus DBX.

Now, operation in the above first embodiment will be described.

Descriptions will be given with a case where read operation is performed as an example. When an address from which data is to be read is input to the timing control circuit 1, the timing control circuit 1 supplies a predetermined control signal to the row decoder 2, bank decoder 4, and column decoder 5 on the basis of this address.

The row decoder 2 decodes the row input address signal supplied from the timing control circuit 1 and informs the word line driver 3 about which word line the word line driver 3 should drive.

The word line driver 3 puts a predetermined word line into an active state under the control of the row decoder 2. In this example, it is assumed that data is to be read from the memory cell C11. Then a word line connected to the memory cells C11 through Cp1 is put into an active state and the other word lines are put into an inactive state.

Data will be read from the memory cells C11 through Cp1 and voltage corresponding to read data will be applied to the divided bit lines BL11 through BLp1 and auxiliary divided bit lines BLX11 through BLXp1.

The column decoder 5 decodes the column input address signal supplied from the timing control circuit 1 and puts one of the column switches CS1 through CSp which corresponds to the result into the ON state. In this example, the memory cell C11 is selected, so an output signal CD1 shown in FIG. 4 goes into the "H" state. As a result, the transfers G1b and G1c go into the ON state and the common bit line GBL1 and auxiliary common bit line GBLX1 are connected to the data bus DB and auxiliary data bus DBX respectively.

Furthermore, when an output signal COL1 goes into the "H" state, the transistor Q2 included in the bank control circuit BC1 shown in FIG. 3(A) goes into the ON state. At this time a signal from the bank decoder 4 is in the "H" state, so the transistor Q1 also goes into the ON state and the divided bit line BL11 is connected to the common bit line GBL1. The same operation is performed on the auxiliary signal side, so the auxiliary divided bit line BLX11 is connected to the auxiliary common bit line GBLX1.

In this case, the bank control circuit BC2 through BCp for the other columns go into the OFF state because the column direction selection signals COL2 through COLp are in the "L" state. As a result, the divided bit line BL21 is not connected to the common bit line GBL2, the divided bit line BL31 is not connected to the common bit line GBL3, and so on. Similarly, the auxiliary divided bit line BLX21 is not connected to the auxiliary common bit line GBLX2, the auxiliary divided bit line BLX31 is not connected to the auxiliary common bit line GBLX3, and so on. That is to say, voltage is not output to the common bit line GBL2 through GBLp or the auxiliary common bit line GBLX2 through GBLXp. As a result, a charging/discharging current does not run through the common bit lines GBL2 through GBLp or the auxiliary common bit lines GBLX2 through GBLXp, resulting in a reduction in power consumption.

Data read from the memory cell C11 is output to the data bus DB and auxiliary data bus DBX via the common bit line GBL1 and auxiliary common bit line GBLX1 respectively.

The I/O circuit 6 increases the voltage of the data read in this way to a predetermined value with the built-in sense amplifier and outputs it.

The operation of reading data stored in a memory cell other than the memory cell C11 is performed in the same way as described above, so descriptions of it will be omitted. The operation of writing data into a memory cell is performed in the same way as described above, except that data is read from the I/O circuit 6 side and is supplied to a memory cell. Therefore, descriptions of it will also be omitted.

As described above, in this embodiment, bank control circuits not to be accessed are put into the OFF state by column direction selection signals. This prevents a charging/discharging current from running through unnecessary common bit lines and auxiliary common bit lines. As a result, the amount of power consumed by an entire unit can be reduced.

To be concrete, in this embodiment, the amplitude of potential is obtained only on one Ncth of the common bit lines. Therefore, if the bit line hierarchy system is adopted, then a charging/discharging current which runs through bit lines is given by

[Numerical Expression 6]

$$Ib = (Cb/Nb \cdot Vb + Cg \cdot Vg/Nc) \cdot f \cdot N \tag{6}$$

If a memory array is divided into four (Nb=4), the capacitance of a common bit line is equal to half of that of a bit line (Cg=Cb/2), and one of eight columns (Nc=8) is selected, then a charging/discharging current is expressed by

[Numerical Expression 7]

$$Ib = (Cb/4 \cdot Vb + Cb/2 \cdot Vg/8) \cdot f \cdot N \tag{7}$$

Moreover, if the amplitude of the potential of a divided bit line and the amplitude of the potential of the common bit line are the same (Vb=Vg), then a charging/discharging current is expressed by

[Numerical Expression 8]

$$Ib = 5/16 \cdot Cb \cdot Vb \cdot f \cdot N \tag{8}$$

$$= 5/16 \cdot Io$$

As a result, a charging/discharging current is reduced significantly, that is to say, by eleven sixteenths (68.75%).

Therefore, the bit line hierarchy system in this embodiment can reduce a charging/discharging current two and three quarters (=68.75/25) times more than the conventional bit line hierarchy system.

Furthermore, if the amplitude of voltage on the common bit line is high, then the following expression is derived from, for example, the numerical expression 5.

[Numerical Expression 9]

$$Ib = (Cb/4 \cdot Vb + Cb/2 \cdot 10 \cdot Vb/8) \cdot f \cdot N \quad (9)$$
$$= (1/4 + 5/8) \cdot Cb \cdot Vb \cdot f \cdot N$$
$$= 7/8 \cdot Io$$

This means that a charging/discharging current can be reduced significantly, that is to say, from more than five times Io to seven eighths times Io.

Furthermore, in this embodiment, the column direction selection lines are located parallel to the common bit lines and auxiliary common bit lines and are also used for sending signals to control the column switches. Therefore, the activity/inactivity of the common bit lines can be controlled without increasing the area of a chip. For example, if column direction selection signals are generated independently of column switch selection signals and signal lines for column direction selection signals are located parallel to word lines, a plurality of column decoder lines and a plurality of buffering circuits must be located in each bank. This increases the area of a chip. However, the above structure in this embodiment can prevent such an increase in the area of a chip.

Now, a second embodiment of the present invention will be described.

Figure 5:
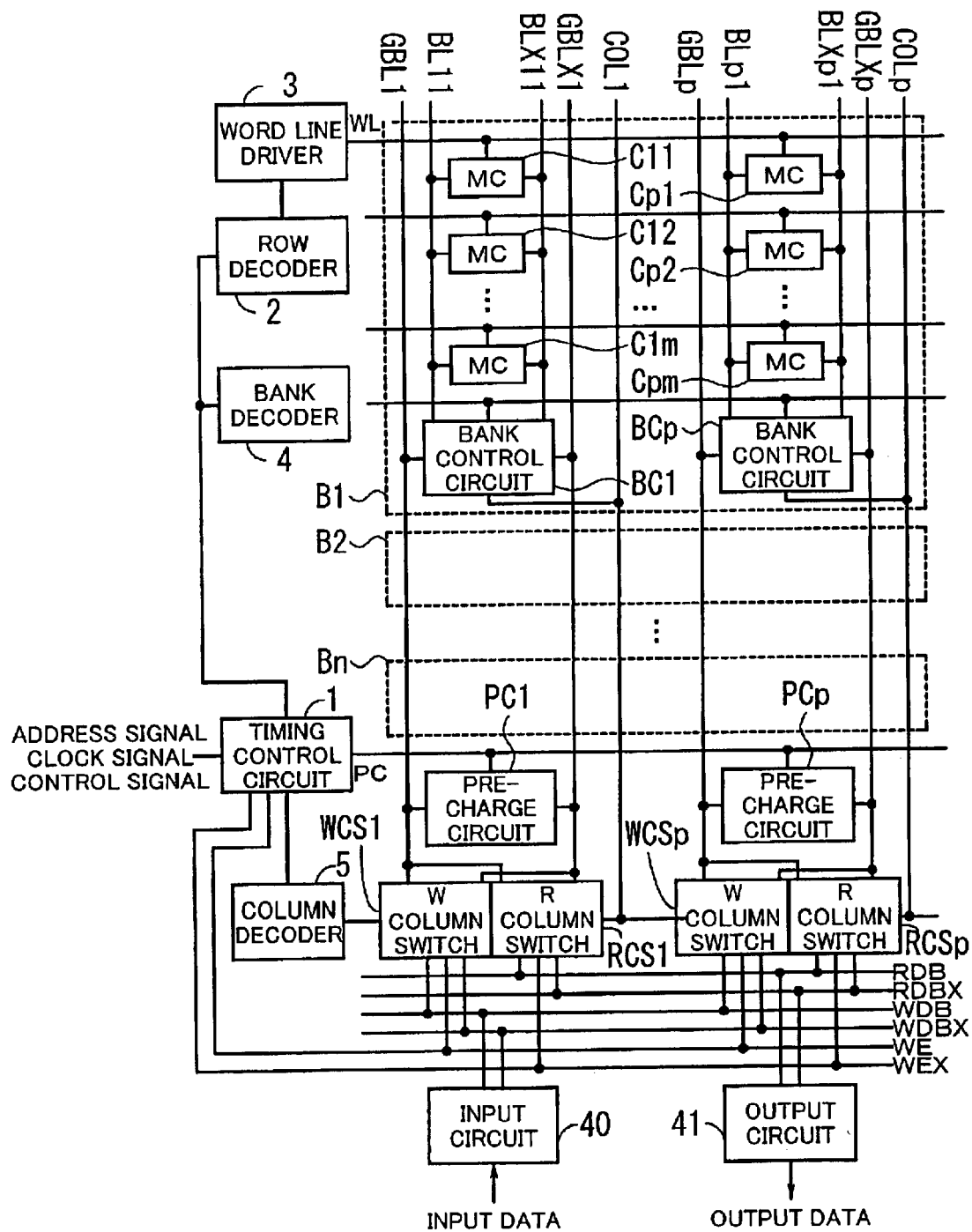
FIG. 5 is a circuit diagram showing the structure of a second embodiment of the present invention.

FIG. 5 is a view showing the structure of a second embodiment of the present invention. Elements in FIG. 5 which correspond to those in FIG. 2 are marked with the same symbols and descriptions of them will be omitted.

The second embodiment shown in FIG. 5 differs from the first embodiment shown in FIG. 2 in that each of the column switches CS1 through CSp is divided into a write-only W column switch and read-only R column switch. That is to say, the column switches CS1 is divided into a write-only W column switch WCS1 and read-only R column switch RCS1, the column switches CS2 is divided into a write-only W column switch WCS2 and read-only R column switch RCS2, and so on.

Moreover, the second embodiment shown in FIG. 5 differs from the first embodiment shown in FIG. 2 in that an INPUT circuit 40 and OUTPUT circuit 41 are located and that write enable signals WE and WEX are sent from the timing control circuit 1. However, the I/O circuit 6 having input and output functions as shown in FIG. 2 is merely divided into the INPUT circuit 40 and OUTPUT circuit 41 and the write enable signals WE and WEX which were not shown in FIG. 2 are merely shown for convenience of explanation.

When data is written, the W column switches WCS1 through WCSp go into the ON state under the control of the column decoder 5 to connect common bit lines GBL1 through GBLp, respectively, to a write data bus WDB and to connect auxiliary common bit lines GBLX1 through GBLXp, respectively, to an auxiliary write data bus WDBX.

When data is read, the R column switches RCS1 through RCSp go into the ON state under the control of the column decoder 5 to connect the common bit lines GBL1 through GBLp, respectively, to a read data bus RDB and to connect the auxiliary common bit lines GBLX1 through GBLXp, respectively, to an auxiliary read data bus RDBX.

Figure 6:
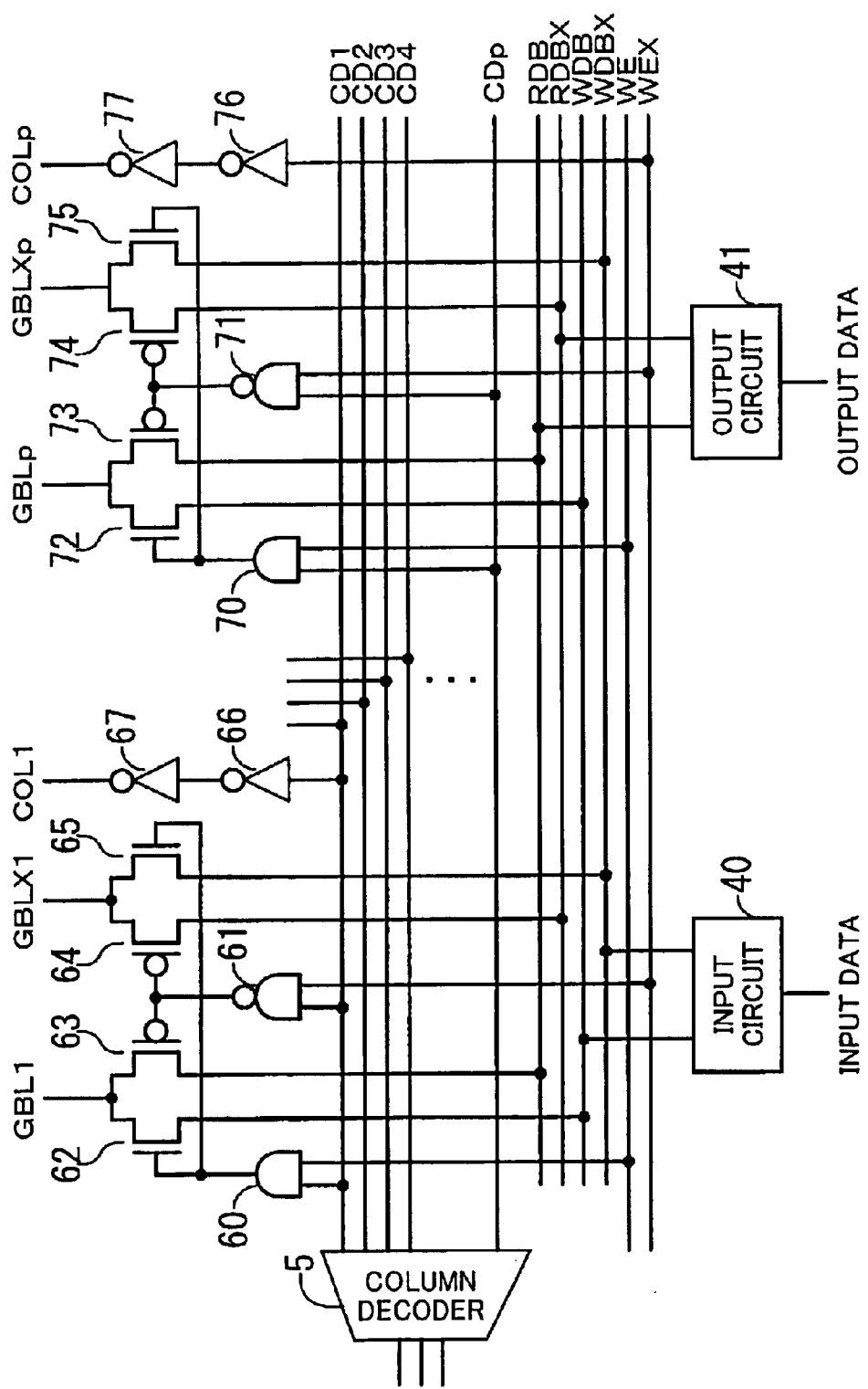
FIG. 6 is a circuit diagram showing an example of the detailed structure of the W column switches and R column switches shown in FIG. 5.

FIG. 6 is a view showing an example of the detailed structure of the W column switches WCS1 through WCSp and R column switches RCS1 through RCSp.

Descriptions will be given with the W column switch WCS1 and R column switch RCS1 as examples. These switches include an AND element 60, a NAND element 61, n-channel transistors 62 and 65, p-channel transistors 63 and 64, and inverters 66 and 67.

The AND element 60 and n-channel transistors 62 and 65 correspond to the W column switch WCS1. The NAND element 61, p-channel transistors 63 and 64, and inverters 66 and 67 correspond to the R column switch RCS1. The inverters 66 and 67 may be included in either of the W column switch WCS1 and R column switch RCS1. Alternatively, the inverters 66 and 67 may be independent of the W column switch WCS1 and R column switch RCS1.

Now, operation in the above embodiment will be described. Operation in the second embodiment is basically the same as that in the first embodiment, so the following descriptions will center on the differences between them.

If output from the AND element 60 is "H," that is to say, if a signal CD1 output from a column decoder 5 and a write enable signal WE are in the "H" state (a state in which data is written), then the n-channel transistors 62 and 65 shown in FIG. 6 go into the ON state. As a result, the common bit line GBL1 and auxiliary common bit line GBLX1 are connected to the write data bus WDB and auxiliary write data bus WDBX, respectively, and data can be written.

On the other hand, if output from the NAND element 61 is "L," that is to say, if a signal CD1 output from the column decoder 5 and an auxiliary write enable signal WEX are in the "H" state (a state in which data is read), then the p-channel transistors 63 and 64 go into the ON state. As a result, the common bit line GBL1 and auxiliary common bit line GBLX1 are connected to the read data bus RDB and auxiliary read data bus RDBX, respectively, and data can be read.

If the n-channel transistors 62 and 65 are in the ON state, the p-channel transistors 63 and 64 are in the OFF state. If the p-channel transistors 63 and 64 are in the ON state, the n-channel transistors 62 and 65 are in the OFF state. As a result, the common bit line GBL1 and auxiliary common bit line GBLX1 are connected only to the read data bus RDB and auxiliary read data bus RDBX, respectively, at the time of reading and are connected only to the write data bus WDB and auxiliary write data bus WDBX, respectively, at the time of writing. This prevents, for example, the write data bus WDB and auxiliary write data bus WDBX from being a load at the time of reading.

As described above, in the second embodiment of the present invention, column switches are divided into the write-only W column switch WCS1 through WCSp and read-only R column switch RCS1 through RCSp, the write-only W column switch WCS1 through WCSp are put into the OFF state during read operation, and the read-only R column switch RCS1 through RCSp are put into the OFF state during write operation. This reduces a drive load at the time of reading and writing. As a result, the amount of power consumed by an entire unit can be reduced.

Now, a third embodiment of the present invention will be described.

Figure 7:
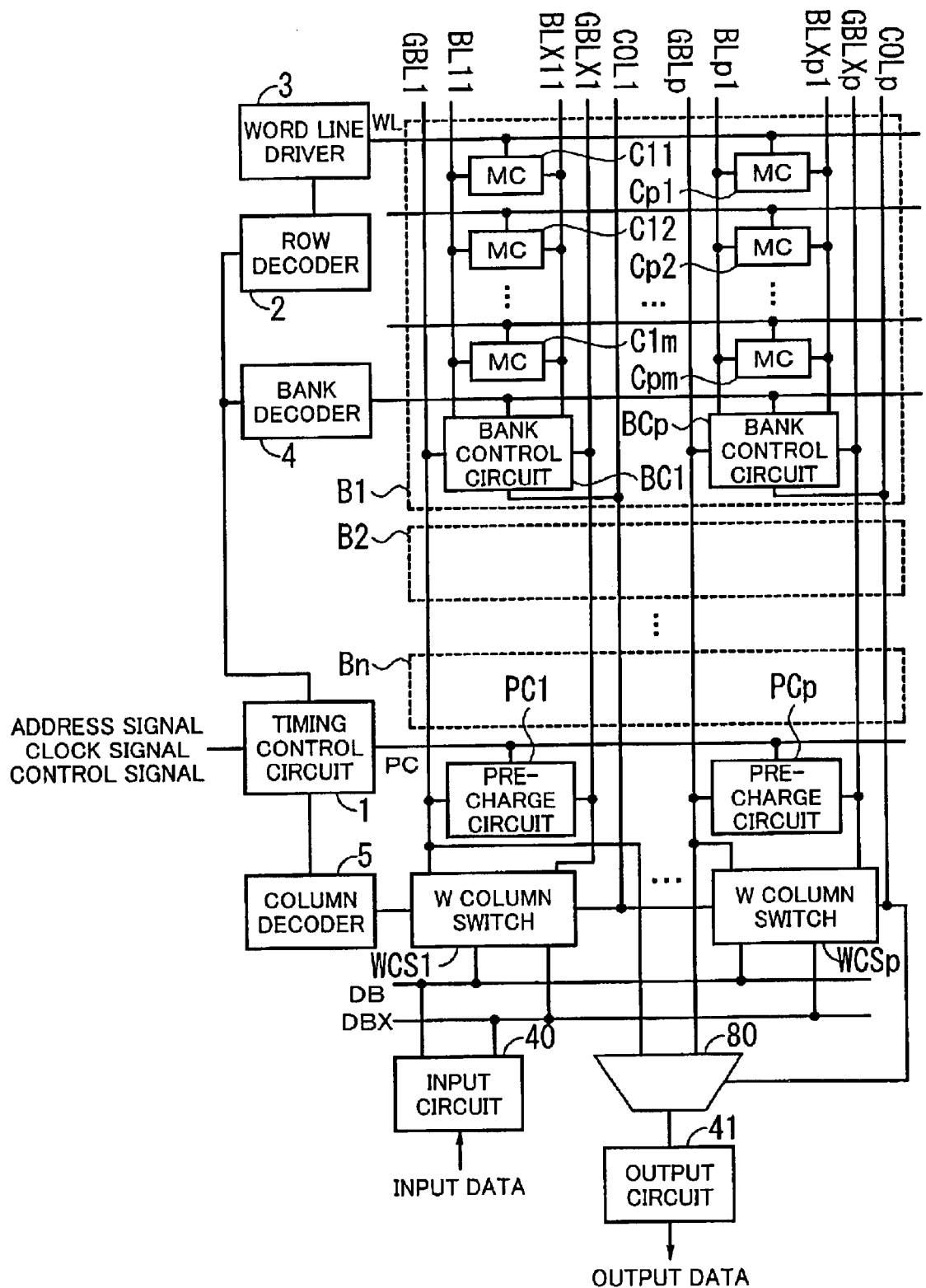
FIG. 7 is a circuit diagram showing the structure of a third embodiment of the present invention.

FIG. 7 is a view showing the structure of a third embodiment of the present invention. Elements in FIG. 7 which correspond to those in FIG. 2 are marked with the same symbols and descriptions of them will be omitted.

The structure of the third embodiment of the present invention is the same as that of the first embodiment shown in FIG. 2, except that the I/O circuit 6 is divided into an INPUT circuit 40 and OUTPUT circuit 41 and the column switches CS1 through CSp are divided into W column switches WCS1 through WCSp and a multiplexer circuit 80.

The multiplexer circuit 80 selects output from common bit lines GBL1 through GBLp according to output from a column decoder 5 and outputs it to the OUTPUT circuit 41.

Figure 8:
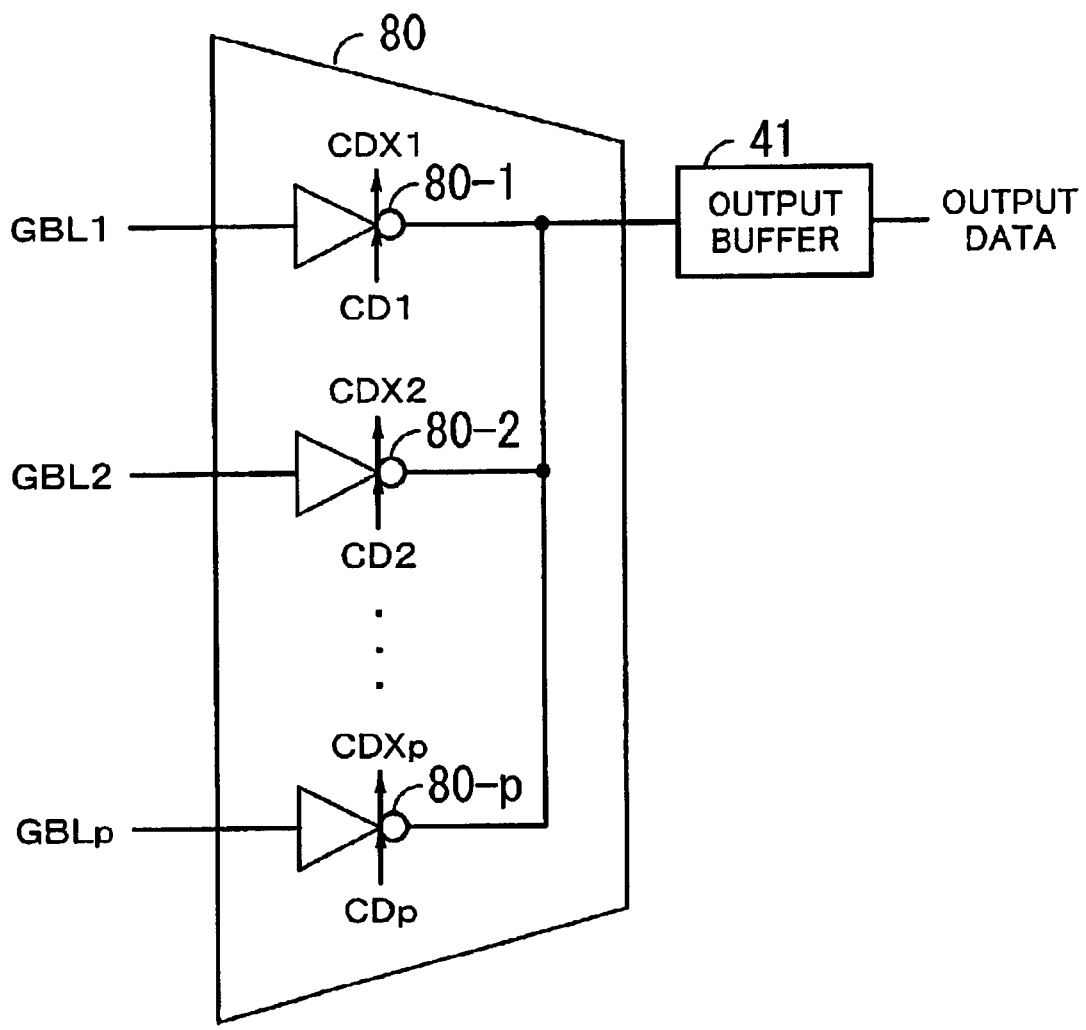
FIG. 8 is a circuit diagram showing an example of the detailed structure of the multiplexer circuit shown in FIG. 7.

FIG. 8 is a view showing an example of the detailed structure of the multiplexer circuit 80. As shown in FIG. 8, the multiplexer circuit 80 includes clocked inverters 80-1 through 80-p. If a signal CD1 output from the column decoder 5 is in the "H" state, then the clocked inverter 80-1 inverts a signal CDX1 and outputs it. If a signal CD1 output from the column decoder 5 is not in the "H" state, then the clocked inverter 80-1 goes into a high-impedance state. The same applies to the clocked inverters 80-2 through 80-p.

Now, operation in the third embodiment of the present invention will be described.

If data stored in, for example, a memory cell C11 is to be read, a bank control circuit BC1 goes into the ON state. This is the same with the above first embodiment. Therefore, data read from the memory cell C11 is supplied to the clocked inverter 80-1 in the multiplexer circuit 80 via the common bit line GBL1.

At this time the signal CD1 output from the column decoder 5 is in the "H" state and the other signals are in the "L" state. Therefore, the clocked inverter 80-1 goes into an operating state and the other clocked inverters 80-2 through 80-p go into a high-impedance state. As a result, a signal applied to the common bit line GBL1 is inverted and is supplied to the OUTPUT circuit 41.

By the way, an input terminal on each of the clocked inverters 80-1 through 80-p is connected to the gate of a transistor included in it. In the circuit shown in FIG. 2, input terminals (the common bit line GBL1 and auxiliary common bit line GBLX1) on the column switch CS1 are connected to the drain or source of a transistor included in it. The same applies to the column switch CS2 through CSp. When a signal flows between a source and drain, it may deteriorate due to ON-state resistance between them. Therefore, with the method shown in FIG. 2, a signal read from a memory cell may deteriorate when it passes through a column switch. However, by inputting data read from a memory cell to a gate, as in this embodiment, such a deterioration of a signal can be prevented.

When the OUTPUT circuit 41 receives the signal output from the multiplexer circuit 80, the OUTPUT circuit 41 amplifies it with a sense amplifier and outputs it.

If write operation is performed, data input via the INPUT circuit 40 is supplied to a desired memory cell via one of the W column switches WCS1 through WCSp. If data is to be written into, for example, the memory cell C11, the W column switch WCS1 goes into the ON state and the data input via the INPUT circuit 40 is supplied to the common bit line GBL1 and auxiliary common bit line GBLX1. Then the bank control circuit BC1 is put into the ON state, the common bit line GBL1 and auxiliary common bit line GBLX1 are connected to a divided bit line BL11 and auxiliary divided bit line BLX11 respectively, and the data is supplied to the divided bit line BL11 and auxiliary divided bit line BLX11. At this time the memory cell C11 has been put into an active state by a word line driver 3, so the data will be written from the divided bit line BL11 and auxiliary divided bit line BLX11 into the memory cell C11.

In the above embodiment, read data is selected by the multiplexer circuit 80 including clocked inverters. This can prevent a signal from deteriorating.

Figure 9:
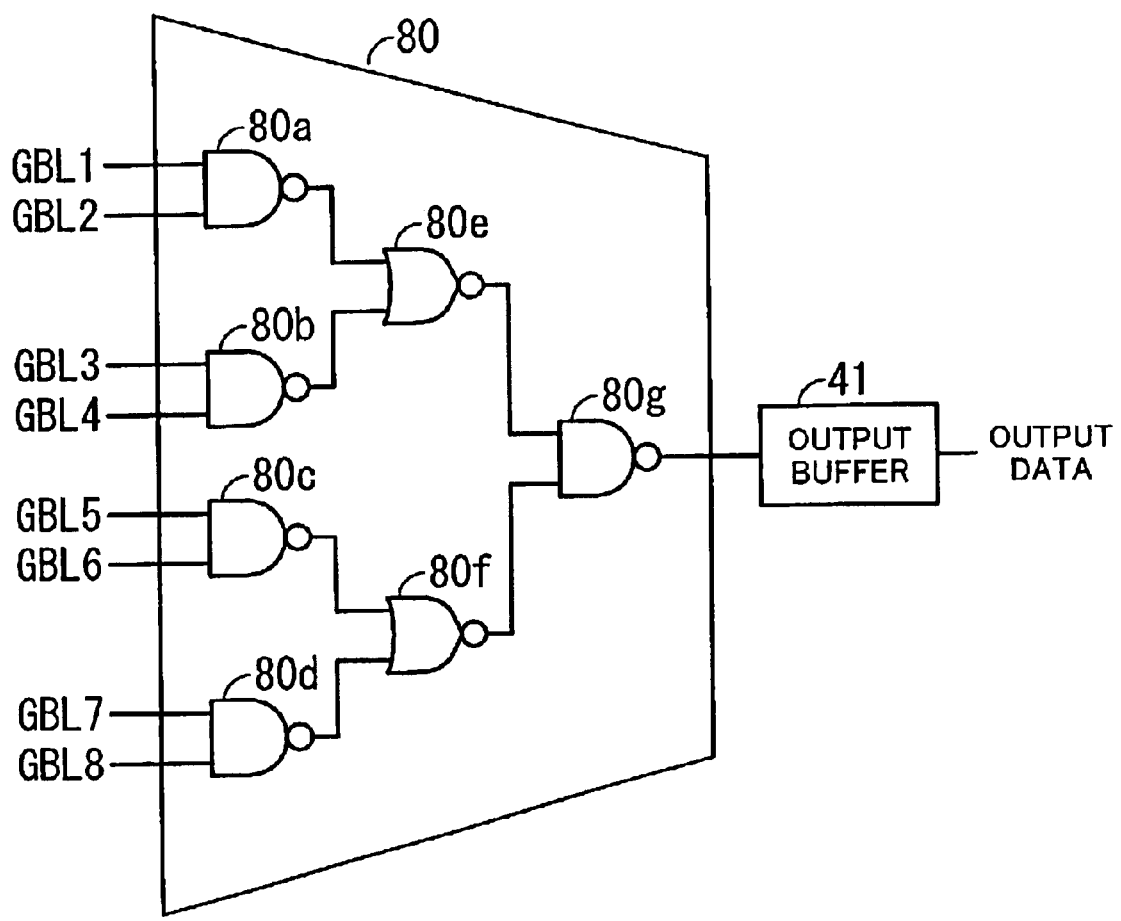
FIG. 9 is a circuit diagram showing another example of the detailed structure of the multiplexer circuit shown in FIG. 7.

FIG. 9 is a view showing another example of the detailed structure of the multiplexer circuit 80. In this case, eight memory cells are arranged in a row direction (p=8). The multiplexer circuit 80 includes NAND elements 80a through 80d and 80g and NOR elements 80e and 80f.

The NAND element 80a finds the logical product of the common bit lines GBL1 and GBL2, inverts a result obtained, and outputs it. The NAND element 80b finds the logical product of the common bit lines GBL3 and GBL4, inverts a result obtained, and outputs it. The NAND element 80c finds the logical product of the common bit lines GBL5 and GBL6, inverts a result obtained, and outputs it. The NAND element 80d finds the logical product of the common bit lines GBL7 and GBL8, inverts a result obtained, and outputs it.

The NOR element 80e finds the logical sum of output from the NAND elements 80a and 80b, inverts a result obtained, and outputs it. The NOR element 80f finds the logical sum of output from the NAND elements 80c and 80d, inverts a result obtained, and outputs it.

The NAND element 80g finds the logical product of output from the NOR elements 80e and 80f, inverts a result obtained, and outputs it.

With the multiplexer circuit 80 having the above structure, "L" will be output from the NAND element 80g in the case of all the common bit lines GBL1 through GBL8 being in the "H" state. If one of the common bit lines GBL1 through GBL8 is in the "L" state, then "H" will be output from the NAND element 80g. Therefore, operation being substantially the same as that in the example shown in FIG. 8 can be realized.

In this embodiment, the common bit lines GBL1 and GBL2, GBL3 and GBL4, GBL5 and GBL6, and GBL7 and GBL8 are connected to the NAND elements 80a through 80d respectively. Usually an input terminal on a NAND element is connected to the gate of a transistor included in it, so a deterioration of a signal read from a memory cell can be prevented. This is the same with the multiplexer circuit 80 shown in FIG. 8.

Now, a fourth embodiment of the present invention will be described.

Figure 10:
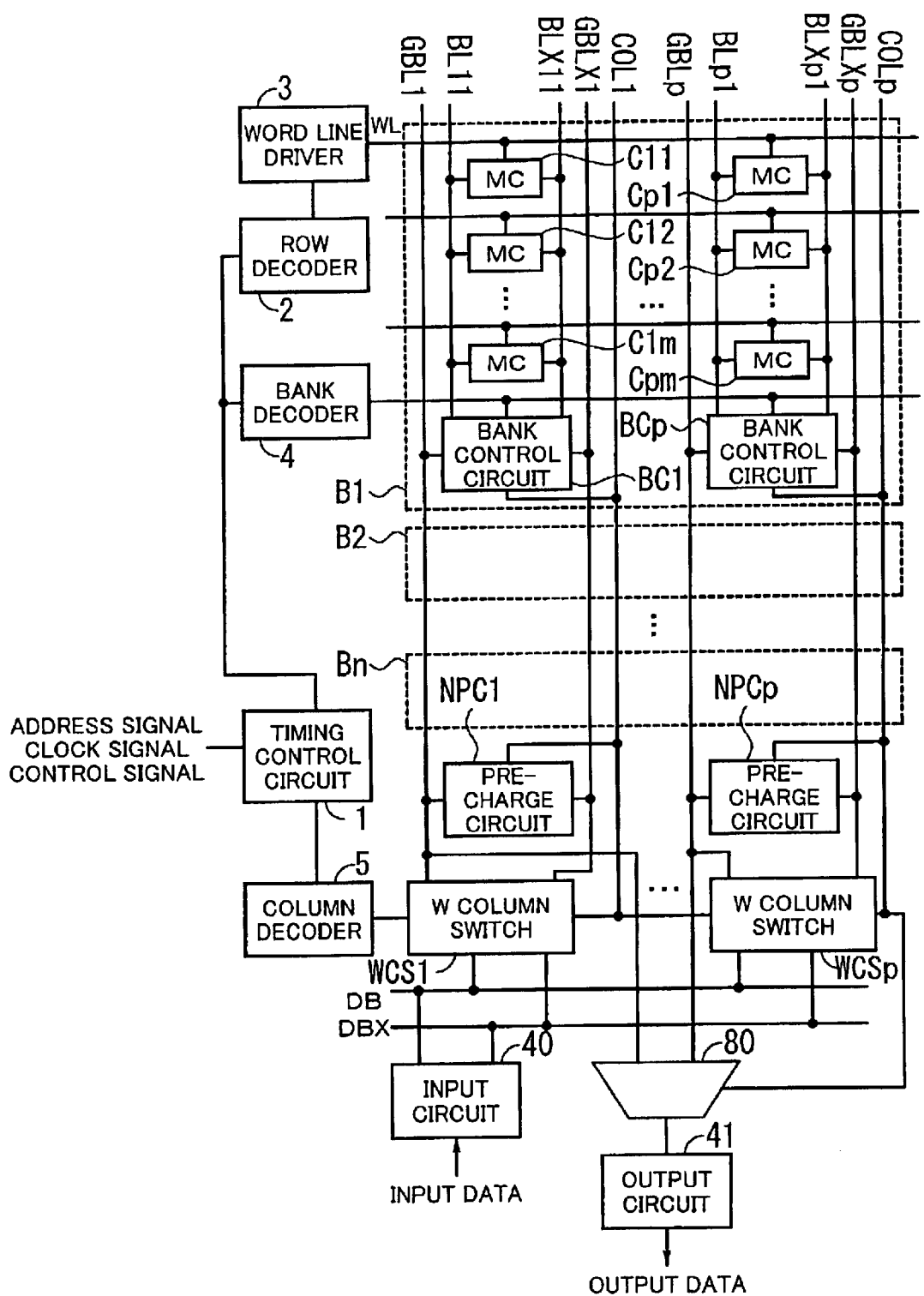
FIG. 10 is a circuit diagram showing the structure of a fourth embodiment of the present invention.

FIG. 10 is a view showing the structure of a fourth embodiment of the present invention. Elements in FIG. 10 which correspond to those in FIG. 7 are marked with the same symbols and descriptions of them will be omitted.

The structure of the fourth embodiment of the present invention is the same as that of the third embodiment shown in FIG. 7, except that the pre-charge circuits PC1 through PCp are replaced by pre-charge circuits NPC1 through NPCp.

Figure 11:
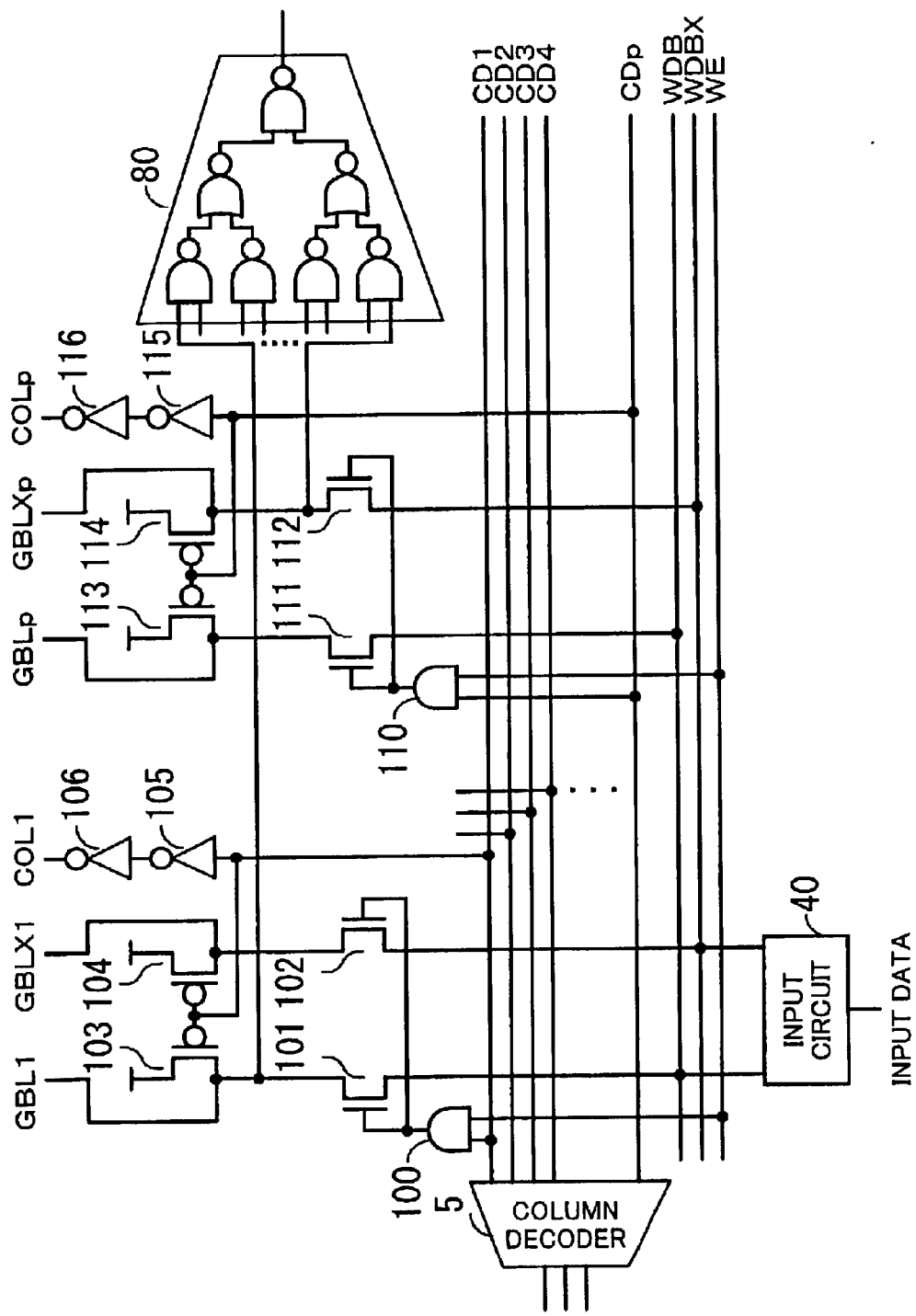
FIG. 11 is a circuit diagram showing an example of the detailed structure of the pre-charge circuits shown in FIG. 10.

FIG. 11 is a view showing an example of the detailed structure of the pre-charge circuits NPC1 through NPCp and W column switches WCS1 through WCSp. Descriptions will be given with the pre-charge circuit NPC1 and a W column switch WCS1 as examples. The pre-charge circuit NPC1 includes p-channel transistors 103 and 104. The W column switch WCS1 includes an AND element 100, n-channel transistors 101 and 102, and inverters 105 and 106. The structure of a multiplexer circuit 80 is the same as that shown in FIG. 9.

Now, operation in the above embodiment will be described.

First, read operation will be described. If data is to be read from, for example, a memory cell C11, then the memory cell C11 is selected by a word line driver 3, a bank control circuit BC1 is put into the ON state, and data is read out to a common bit line GBL1 and auxiliary common bit line GBLX1. This is the same with the above case.

At this time a write enable signal WE shown in FIG. 11 is in the "L" state, so output from the AND element 100 goes into the "L" state and the n-channel transistors 101 and 102 go into the OFF state. As a result, the data read out from the memory cell C11 is supplied only to the multiplexer circuit 80 and is output. This data will not be supplied to a write data bus WDB and auxiliary write data bus WDBX.

At this time signals CD1 through CDp output from a column decoder 5 are all in the "L" state but the signal CD1. Therefore, the p-channel transistors 103 and 104 go into the OFF state and all the p-channel transistors corresponding to the other columns go into the ON state. These p-channel transistors are connected to power supply, so common bit lines GBL2 through GBLp and auxiliary common bit lines GBLX2 through GBLXp will be pre-charged by a power supply voltage. At this time all the W column switches WCS2 through WCSp are in the OFF state, so the power supply voltage will not be applied to the write data bus WDB and auxiliary write data bus WDBX.

Next, write operation will be described. If data is to be written into, for example, the memory cell C11, then the memory cell C11 is selected by the word line driver 3, the bank control circuit BC1 is put into the ON state, and the common bit line GBL1 and auxiliary common bit line GBLX1 are connected to the memory cell C11. This is the same with the above case.

At this time the write enable signal WE shown in FIG. 11 is in the "H" state and the signal CD1 output from the column decoder 5 is in the "H" state. Therefore, output from the AND element 100 goes into the "H" state and the n-channel transistors 101 and 102 go into the ON state. As a result, the write data bus WDB and auxiliary write data bus WDBX are connected to the memory cell C11 and data can be written into the memory cell C11.

The signals CD1 through CDp output from the column decoder 5 are all in the "L" state but the signal CD1. Therefore, the p-channel transistors 103 and 104 go into the OFF state and all the p-channel transistors corresponding to the other columns go into the ON state. These p-channel transistors are connected to the power supply, so the common bit lines GBL2 through GBLp and auxiliary common bit lines GBLX2 through GBLXp will be pre-charged by a power supply voltage. This is the same with the above case. At this time all the W column switches WCS2 through WCSp are in the OFF state, so the power supply voltage will not be applied to the write data bus WDB and auxiliary write data bus WDBX.

As described above, except for a column from which data is to be read or into which data is to be written, the common bit lines GBL1 through GBLp are put into a pre-charged state by the pre-charge circuits NPC1 through NPCp, respectively, and the auxiliary common bit lines GBLX1 through GBLXp are also put into a pre-charged state by the pre-charge circuits NPC1 through NPCp respectively. This prevents the common bit lines GBL1 through GBLp and auxiliary common bit lines GBLX1 through GBLXp from going into a floating state. As a result, coupling resistance to external noise can be improved.

Now, a fifth embodiment of the present invention will be described.

Figure 12:
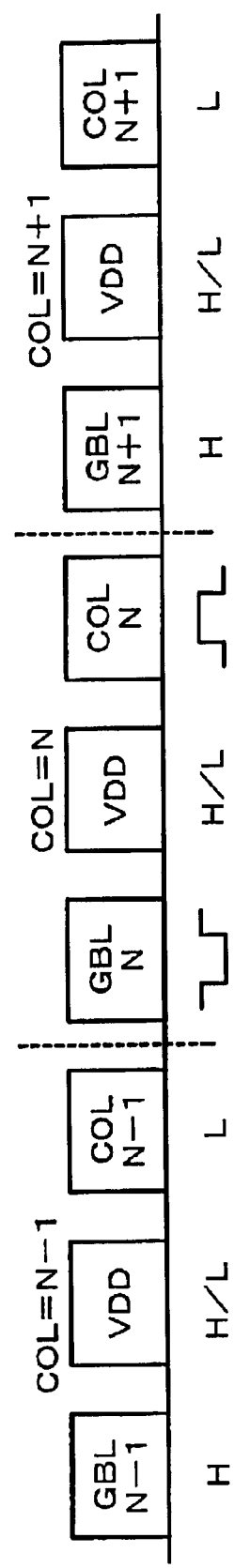
FIG. 12 is a circuit diagram showing the structure of a fifth embodiment of the present invention.

FIG. 12 is a view showing the structure of a fifth embodiment of the present invention. As shown in FIG. 12, in the fifth embodiment of the present invention, a power supply line is located between a common bit line and column direction selection signal line. That is to say, this example indicates how wirings are arranged in the (N−1)th through (N+1)th columns and that data is to be read from the Nth column.

Now, descriptions will be given with the Nth column in FIG. 12 as an example. A power supply voltage line VDD is located between a common bit line GBLN and column direction selection signal line COLN and all of these three wirings are located on the same wiring layer.

If the common bit line GBLN and column direction selection signal line COLN are located on the same wiring layer, noise may leak out from the column direction selection signal line COLN to the common bit line GBLN at the time of data being read (at this time a small signal will be output).

By locating the power supply voltage line VDD on which voltage is always constant between the common bit line GBLN and column direction selection signal line COLN, the common bit line GBLN is shielded and noise leakage can be prevented.

In the above embodiment, the power supply voltage line VDD is located. However, by locating an earth line, the same effect can be obtained. Moreover, by locating a wiring which maintains a constant voltage at the time of data being read, the same effect can be expected.

In the above embodiment, descriptions have been given with only the common bit lines GBL1 through GBLp as examples. However, auxiliary common bit lines GBLX1 through GBLXp can also be shielded by the same method.

Furthermore, in the above embodiment, the common bit lines GBL1 through GBLp and column direction selection signal lines COL1 through COLp are located on the same layer. However, they can be located on two different layers. With this structure, there is no need of locating power supply voltage lines or the like between them to prevent noise leakage.

Now, a sixth embodiment of the present invention will be described.

Figure 13:
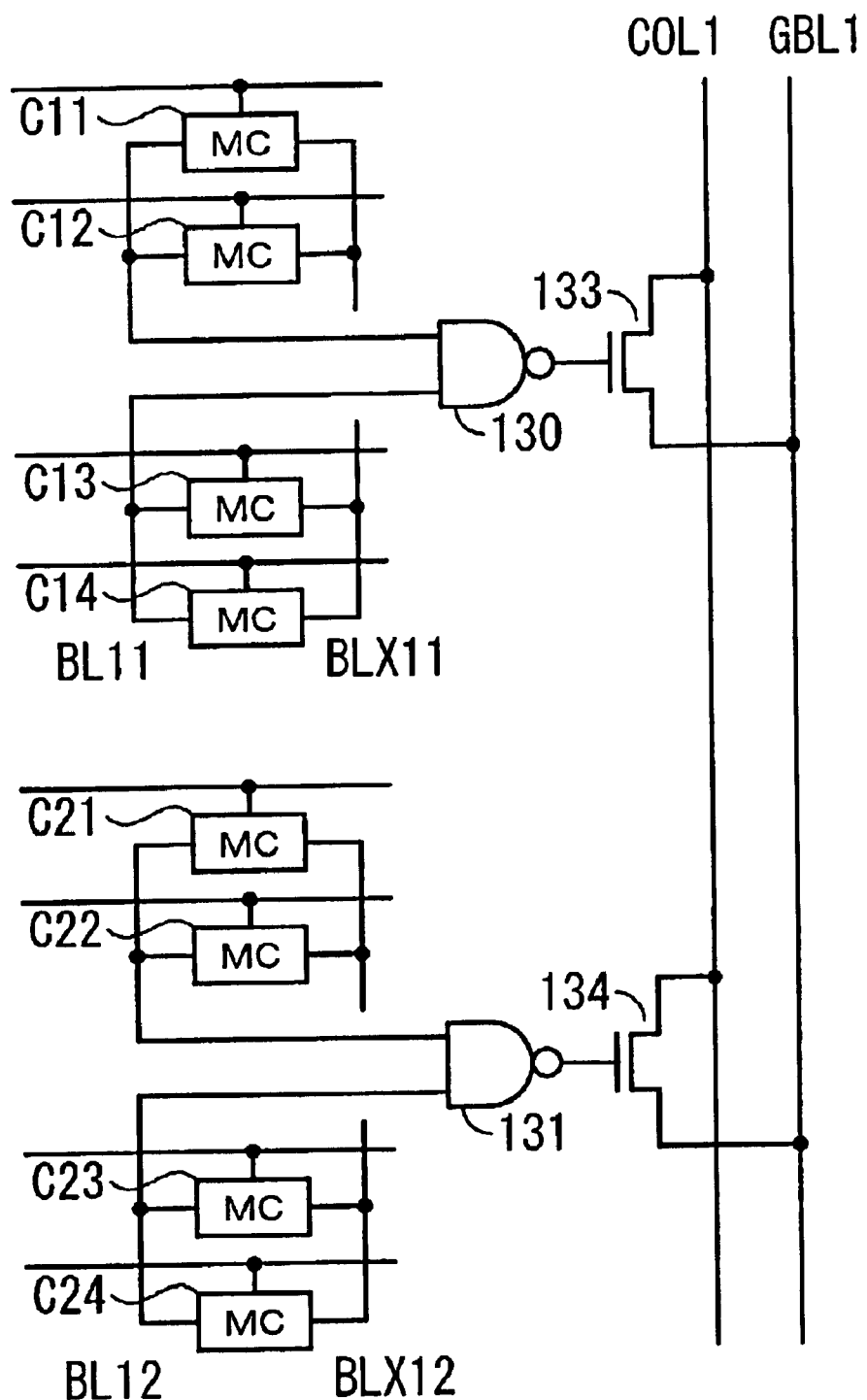
FIG. 13 is a circuit diagram showing the structure of a sixth embodiment of the present invention.

FIG. 13 is a view showing the structure of a sixth embodiment of the present invention. In FIG. 13, only important portions of the present invention are shown.

In this example, a bank B1 in the first column includes memory cells C11 through C14. Output from one of the memory cells C11 and C12 is connected to one terminal on a NAND element 130 and output from one of the memory cells C13 and C14 is connected to the other terminal on the NAND element 130.

A bank B2 in the first column includes memory cells C21 through C24. Output from one of the memory cells C21 and C22 is connected to one terminal on a NAND element 131 and output from one of the memory cells C23 and C24 is connected to the other terminal on the NAND element 131.

Output from the NAND element 130 is input to an n-channel transistor 133 and output from the NAND element 131 is input to an n-channel transistor 134.

The n-channel transistor 133 is connected to a column direction selection signal COL1 and common bit line GBL1. Similarly, the n-channel transistor 134 is connected to the column direction selection signal COL1 and common bit line GBL1.

Now, operation in the above embodiment will be described.

Descriptions will be given with a case where data is to be read from the memory cell C11 as an example. In this case, first the memory cell C11 is selected by a word line and data stored in the memory cell C11 is output.

Divided bit lines connected to the input terminals on the NAND elements 130 and 131 have been pulled up to the "H" level, so a divided bit line corresponding to the selected memory cell C11 goes into the "H" or "L" state according to the data stored in the memory cell C11 and the other divided bit lines go into the "H" state.

Therefore, if output from the memory cell C11 is in the "L" state, then the upper and lower input terminals on the NAND element 130 go into the "L" and "H" states respectively. As a result, output from the NAND element 130 goes into the "H" state and the n-channel transistor 133 goes into the ON state.

It is assumed that when the column direction selection signal COL1 is selected, it goes into the "L" state. Then the n-channel transistor 133 goes into the ON state and the common bit line GBL1 goes into the "L" state.

Both the input terminals on the NAND element 131 are in the "H" state, so output from it goes into the "L" state. As a result, the n-channel transistor 134 goes into the OFF state and the state of the common bit line GBL1 does not change.

On the other hand, if the data read from the memory cell C11 is in the "H" state, then output from the NAND element 130 goes into the "L" state and, as described above, output from the NAND element 131 also goes into the "L" state. As a result, the n-channel transistor 133 goes into the OFF state and the common bit line GBL1 goes into the "H" state.

Output from all the NAND elements (not shown) in the columns but the first column goes into the "L" state, so all the common bit lines GBL2 through GBLp go into the "H" state. As a result, data will be output only from the first column.

A case where data is to be read from the memory cell C11 has been described. However, even if data is to be read from another memory cell, the same operation that has been described above will be performed.

Moreover, a case where data is to be read from a memory cell in the first column has been described. However, even if data is to be read from a memory cell in another column, the same operation will be performed.

Unlike the first embodiment shown in FIG. 2, a bank decoder is unnecessary in the above embodiment. The area of a chip therefore can be reduced by simplifying circuits.

Now, a seventh embodiment of the present invention will be described.

Figure 14:
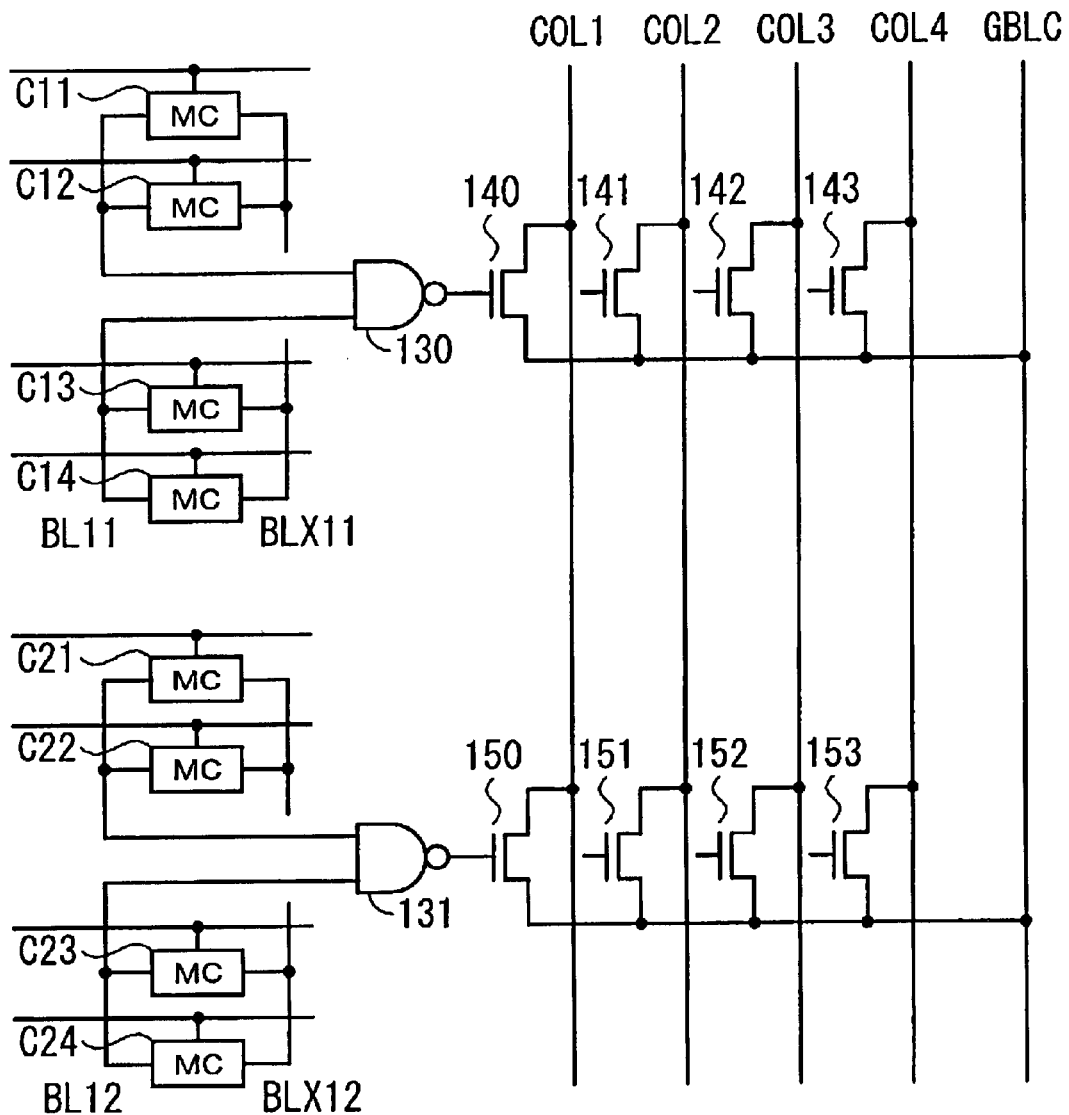
FIG. 14 is a circuit diagram showing the structure of a seventh embodiment of the present invention.
Figure 15:
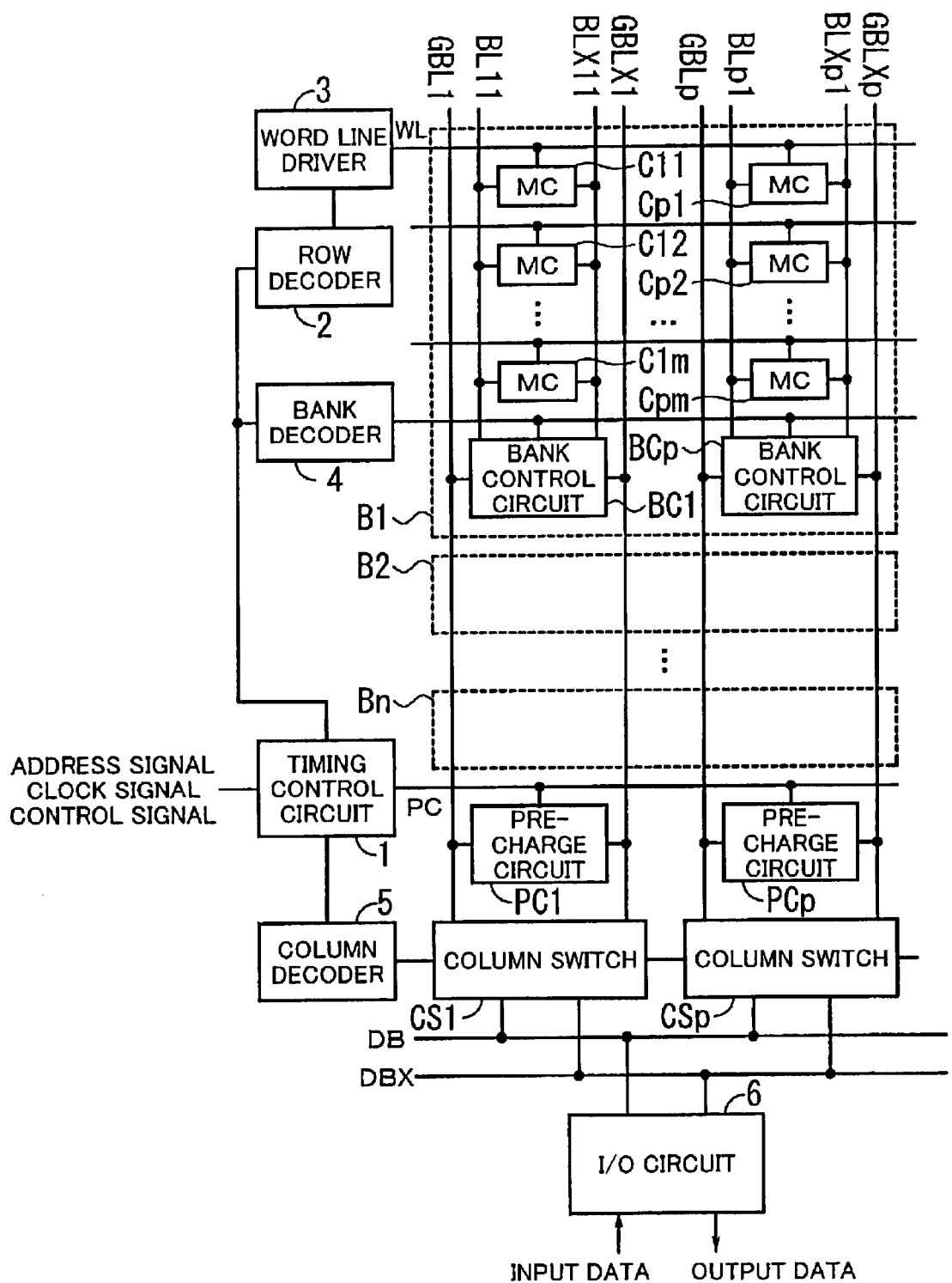
FIG. 15 is a circuit diagram showing the structure of a conventional semiconductor memory.

FIG. 14 is a view showing the structure of a seventh embodiment of the present invention. Elements in FIG. 14 which correspond to those in FIG. 13 are marked with the same symbols and descriptions of them will be omitted.

In this example, source (or drain) terminals on n-channel transistors 140 through 143 are connected to column direction selection signals COL1 through COL4, respectively, and all their drain (or source) terminals are connected to a common bit line GBLC. The gate of the n-channel transistor 140 is connected to a NAND element 130 corresponding to a bank B1 in the first column, the gate of the n-channel transistor 141 is connected to a NAND element (not shown) corresponding to a bank B1 in the second column, the gate of the n-channel transistor 142 is connected to a NAND element (not shown) corresponding to a bank B1 in the third column, and the gate of the n-channel transistor 143 is connected to a NAND element (not shown) corresponding to a bank B1 in the fourth column.

Source (or drain) terminals on n-channel transistors 150 through 153 are connected to the column direction selection signals COL1 through COL4, respectively, and all their drain (or source) terminals are connected to the common bit line GBLC. The gate of the n-channel transistor 150 is connected to a NAND element 131 corresponding to a bank B2 in the first column, the gate of the n-channel transistor 151 is connected to a NAND element (not shown) corresponding to a bank B2 in the second column, the gate of the n-channel transistor 152 is connected to a NAND element (not shown) corresponding to a bank B2 in the third column, and the gate of the n-channel transistor 153 is connected to a NAND element (not shown) corresponding to a bank B2 in the fourth column.

Except for the above, the structure of the seventh embodiment is the same as that of the sixth embodiment shown in FIG. 13.

Now, operation in the seventh embodiment of the present invention will be described.

It is assumed that data is to be read from a memory cell C11. If data stored in the memory cell C11 is in the "L" state, then output from the NAND element 130 goes into the "H" state. As a result, the n-channel transistor 140 goes into the ON state and voltage applied to the column direction selection signal COL1 will be supplied to the common bit line GBLC. It is assumed that when the column direction selection signal COL1 is selected, it goes into the "L" state. Then the common bit line GBLC goes into the "L" state.

Output from the NAND element 131 is in the "L" state, so the n-channel transistor 150 goes into the OFF state. All the n-channel transistors 141 through 143 and 151 through 153 go into the OFF state. The n-channel transistors 141 through 143 and 150 through 153 therefore do not influence the common bit line GBLC.

On the other hand, if data stored in the memory cell C11 is in the "H" state, then output from the NAND element 130 goes into the "L" state. At this time output from the NAND element 131 is in the "L" state, so the n-channel transistor 150 goes into the OFF state. All the n-channel transistors 141 through 143 and 151 through 153 go into the OFF state, so the common bit line GBLC goes into the "H" state.

Therefore, a logical value held by data output from a memory cell to be read and a logical value held by the data supplied to the common bit line GBLC are the same. This operation will be performed when any memory cell is selected. As a result, data stored in a memory cell can be read out.

In the above embodiment, only the common bit line GBLC is used and other common bit lines are unnecessary. Therefore, compared with the sixth embodiment shown in FIG. 13, the number of wirings can be reduced, resulting in chips with a smaller area. Furthermore, by reducing a load caused by common bit lines, the operation of semiconductor memories can be speeded up.

Finally, the circuits shown in the first through seventh embodiments are simple examples. It is a matter of course that the scope of the present invention is not limited to these cases.

As has been described in the foregoing, a semiconductor memory having divided bit lines obtained by dividing each of bit lines to which memory cells are connected into more than one in a column direction and common bit lines used for getting voltage output to the divided bit lines column by column, according to the present invention, comprises a row direction selection circuit for selecting predetermined memory cell groups in a row direction in response to a row input address signal, a column direction selection circuit for selecting predetermined memory cell groups in the column direction in response to a column input address signal, and connection-disconnection circuits which connect a divided bit line corresponding to a column selected by the column direction selection circuit of divided bit lines connected to memory cell groups, respectively, selected by the row direction selection circuit to the corresponding common bit line and which do not connect divided bit lines corresponding to the other columns. Therefore, by preventing a charging/discharging current from running through common bit lines not to be accessed, the amount of power consumed by an entire unit can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory having divided bit lines obtained by dividing each of bit lines to which memory cells are connected into more than one in a column direction and common bit lines used for getting voltage output to the divided bit lines column by column, the memory comprising:
   a row direction selection circuit for selecting predetermined memory cell groups in a row direction in response to a row input address signal;
   a column direction selection circuit for selecting predetermined memory cell groups in the column direction in response to a column input address signal;
   connection-disconnection circuits which connect a divided bit line corresponding to a column selected by the column direction selection circuit of divided bit lines connected to memory cell groups, respectively, selected by the row direction collection circuit to the corresponding common bit line and which do not connect the divided bit lines corresponding to the other columns to the corresponding common bit lines, the connection-disconnection circuits located according to the divided bit lines; and
   column direction selection signal lines for controlling the connection-disconnection circuits according to the result of selection by the column direction selection circuit are located parallel to the common bit lines.

2. The semiconductor memory according to claim 1, wherein the divided bit lines and the common bit lines make pairs of an ordinary signal line for ordinary signals and auxiliary signal line for auxiliary signals.

3. The semiconductor memory according to claim 1, wherein:
   the common bit lines and the column direction selection signal lines are located on the same wiring layer; and
   a signal line which keeps predetermined potential at the time of reading is located between the common bit line and the column direction selection signal line in the same column.

4. The semiconductor memory according to claim 3, wherein the signal line which keeps predetermined potential is a power supply voltage line, an earth voltage line, or a predetermined signal line related to writing.

5. The semiconductor memory according to claim 1, wherein the common bit lines and the column direction selection signal lines are located on different wiring layers.

6. The semiconductor memory according to claim 1, wherein:
   the common bit lines are connected to a common data bus via column switches which go into the ON or OFF state according to the result of selection by the column direction selection circuit; and the column direction selection signals are also used as signals for controlling the column switches.

7. The semiconductor memory according to claim 6, wherein:
   each or the column switches includes a write-only column switch and read-only column switch; and the write-only column switch is connected to a write common data bus and the read-only column switch is connected to a read common data bus.

8. The semiconductor memory according to claim 1, wherein:
   the common bit lines are connected to a read common data bus via a multiplexer; and
   each of the common bit lines is connected to the gate of a transistor included in the multiplexer.

9. The semiconductor memory according to claim 1, further comprising:
   pre-charging circuits for pie-charging the common bit lines; and
   a pre-charging circuit control circuit for putting a pre-charging circuit corresponding to the column selected by the column direction selection circuit into a non-operating state and for putting the other pre-charging circuits into an operating state.

10. The semiconductor memory according to claim 1, further comprising transistors located according the divided bit lines, wherein the transistors connect or disconnect the common bit lines located according to columns and the column direction selection signal lines according to voltage on the divided bit lines.

11. The semiconductor memory according to claim 10, wherein the common bit lines located according to columns are integrated into one line to synthesize output from all the columns.

12. A semiconductor memory which includes a memory cell array comprised of a plurality of memory cells, the semiconductor memory comprising:
   a plurality of banks which are arranged in a column direction, said plurality of banks being formed by dividing said memory cell array in the column direction;
   a plurality of divided bit lines which are provided for respective banks and columns, said plurality of divided bit lines being formed by dividing bit lines to which said memory cells are connected in the column direction;
   a plurality of common bit line in which are provided for respective columns and shared by said plurality of banks, said plurality of common bit lines being supplied with voltage outputted to the divided bit lines;
   a data bus which is shared by said plurality of common bit lines;
   a row direction selection circuit which generates a row direction selection signal for selecting predetermined memory cells in a row direction in response to a row input address signal;
   a column direction selection circuit which generates a column direction selection signal for selecting predetermined memory cells in the column direction in response to a column input address signal;
   column switches which select one of the plurality of common bit lines in response to said column direction selection signal and connects the selected common bit line to said data bus; and
   connection-disconnection circuits which are provided for respective divided bit lines,
   wherein said connection-disconnection circuits select one of the divided bit lines in response to said column direction selection signal and connect the selected divided bit line to the corresponding common bit line, said selected divided bit line being connected to the memory cells selected according to said row direction selection signal, and wherein said connection-disconnection circuits do not connect the other divided bit lines than said selected divided bit line to the corresponding common bit lines.

13. The semiconductor memory according to claim 12, wherein:

each of the column switches includes a write-only column switch and read-only column switch; and the write-only column switch is connected to a write common data bus and the read-only column switch is connected to a read common data bus.

14. The semiconductor memory according to claim 12, wherein:

the common bit lines are connected to a read common data bus via a multiplexer; and each of the common bit lines is connected to the gate of a transistor included in the multiplexer.

15. The semiconductor memory according to claim 12, further comprising:

pre-charging circuits for pre-charging the common bit lines; and a pre-charging circuit control circuit for putting a pre-charging circuit corresponding to the column selected by the column direction selection circuit into a non-operating state and for putting the other pre-charging circuits into an operating state.

16. The semiconductor memory according to claim 12, further comprising transistors located according the divided bit lines, wherein the transistors connect or disconnect the common bit lines located according to columns and the column direction selection signal lines according to voltage on the divided bit lines.

17. The semiconductor memory according to claim 16, wherein the common bit lines located according to columns are integrated into one line to synthesize output from all the columns.

* * * * *